United States Patent
Miyasaka et al.

(10) Patent No.: US 6,297,754 B1
(45) Date of Patent: *Oct. 2, 2001

(54) DECODING DEVICE

(75) Inventors: Shuji Miyasaka; Takeshi Fujita; Masahiro Sueyoshi; Akihisa Kawamura; Masaharu Matsumoto; Takashi Katayama; Kazutaka Abe; Kousuke Nishio, all of Osaka (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/538,674

(22) Filed: Mar. 30, 2000

(30) Foreign Application Priority Data

Mar. 30, 1999 (JP) .................................................. 11-090286

(51) Int. Cl.[7] .................................................... H03M 7/40
(52) U.S. Cl. ............................................................ 341/65
(58) Field of Search ................................ 341/65, 106, 67; 714/759

(56) References Cited

U.S. PATENT DOCUMENTS 5,617,089 * 4/1997 Kinouchi et al. ...................... 341/65
6,157,326 * 12/2000 Van Der Vleuten et al. ......... 341/65

* cited by examiner

*Primary Examiner*—Tuan T. Lam
(74) *Attorney, Agent, or Firm*—Michael K. Kelly; Snell & Wilmer, LLP

(57) ABSTRACT

A decoding device for decoding a data stream includes a decoding table including a first region and a second region; a first decoder; and a second decoder. The first region defines a relationship between first data having a predetermined number of bits and a result of decoding a portion of the first data having bits smaller than or equal to the predetermined number. The second region defines a relationship between concatenated data obtained by concatenating the first data with second data having additional bits and a result of decoding the concatenated data. The first decoder reads the first data from the data stream; decodes the portion of the first data based on the first region; determines whether the decoding of the portion of the first data is completed or not; and when the decoding of the portion of the first data is completed, outputs a result of the decoding of the portion of the first data. When the decoding of the portion of the first data is not completed, the second decoder reads the second data out of the data stream; concatenates the first data with the second data to generate the concatenated data; decodes the concatenated data based on the second region; and outputs a result of the decoding of the concatenated data.

10 Claims, 12 Drawing Sheets

FIG. 3

Table 300:

| fs[kHz] | 44,1,48 |
|---|---|
| num_swb_long_window | 49 |

| swb | swb_offset_long_window |
|---|---|
| 0 | 0 |
| 1 | 4 |
| 2 | 8 |
| 3 | 12 |
| 4 | 16 |
| 5 | 20 |
| 6 | 24 |
| 7 | 28 |
| 8 | 32 |
| 9 | 36 |
| 10 | 40 |
| 11 | 48 |
| 12 | 56 |
| 13 | 64 |
| 14 | 72 |
| 15 | 80 |
| 16 | 88 |
| 17 | 96 |
| 18 | 108 |
| 19 | 120 |
| 20 | 132 |
| 21 | 144 |
| 22 | 160 |
| 23 | 176 |
| 24 | 196 |
| 25 | 216 |
| 26 | 240 |
| 27 | 264 |
| 28 | 292 |
| 29 | 320 |
| 30 | 352 |
| 31 | 384 |
| 32 | 416 |
| 33 | 448 |
| 34 | 480 |
| 35 | 512 |
| 36 | 544 |
| 37 | 576 |
| 38 | 608 |
| 39 | 640 |
| 40 | 672 |
| 41 | 704 |
| 42 | 736 |
| 43 | 768 |
| 44 | 800 |
| 45 | 832 |
| 46 | 864 |
| 47 | 896 |
| 48 | 928 |
|  | 1024 |

| Huffman code | Code length | Result of decoding |
|---|---|---|
| 0 | 1 | 0 |
| 100 | 3 | 8 |
| 101 | 3 | 1 |
| 1100 | 4 | 9 |
| 110100 | 6 | 17 |
| 110101 | 6 | 10 |
| 110110 | 6 | 16 |
| 110111 | 6 | 2 |
| 1110000 | 7 | 25 |
| 1110001 | 7 | 11 |
| 1110010 | 7 | 18 |
| 1110011 | 7 | 24 |
| 1110100 | 7 | 3 |
| 11101010 | 8 | 19 |
| 11101011 | 8 | 26 |
| 11101100 | 8 | 12 |
| 11101101 | 8 | 33 |
| 11101110 | 8 | 13 |
| 11101111 | 8 | 41 |
| 11110000 | 8 | 27 |
| 11110001 | 8 | 20 |
| 11110010 | 8 | 4 |
| 11110011 | 8 | 32 |
| 111101000 | 9 | 34 |
| 111101001 | 9 | 21 |
| 111101010 | 9 | 42 |
| 111101011 | 9 | 5 |
| 111101100 | 9 | 49 |
| 111101101 | 9 | 40 |
| 111101110 | 9 | 14 |
| 111101111 | 9 | 35 |
| 111110000 | 9 | 29 |
| 111110001 | 9 | 28 |
| 111110010 | 9 | 43 |
| 111110011 | 9 | 22 |
| 111110100 | 9 | 50 |
| 111110101 | 9 | 15 |
| 1111101100 | 10 | 30 |
| 1111101101 | 10 | 6 |
| 1111101110 | 10 | 48 |
| 1111101111 | 10 | 36 |
| 1111110000 | 10 | 57 |
| 1111110001 | 10 | 37 |
| 1111110010 | 10 | 58 |
| 1111110011 | 10 | 44 |
| 1111110100 | 10 | 51 |
| 1111110101 | 10 | 23 |
| 1111110110 | 10 | 59 |
| 1111110111 | 10 | 52 |
| 1111111000 | 10 | 45 |
| 1111111001 | 10 | 38 |
| 1111111010 | 10 | 31 |
| 11111110110 | 11 | 56 |
| 11111110111 | 11 | 7 |
| 11111111000 | 11 | 53 |
| 11111111001 | 11 | 46 |
| 11111111010 | 11 | 60 |
| 11111111011 | 11 | 39 |
| 11111111100 | 11 | 47 |
| 11111111101 | 11 | 61 |
| 111111111100 | 12 | 62 |
| 111111111101 | 12 | 54 |
| 111111111110 | 12 | 55 |
| 111111111111 | 12 | 63 |

FIG. 6

| Address column | Data column | | | Address column | Data column | | |
|---|---|---|---|---|---|---|---|
| | First field (code length) | Second field (result of decoding) | | | Third field (Huffman code) | Fourth field (code length) | Fifth field (result of decoding) |
| 0000000 | (1) | (0) | | 10000000 | (11101010) | (8) | (19) |
| 0000001 | (1) | (0) | | 10000001 | (11101011) | (8) | (26) |
| ~ | ~ | ~ | | 10000010 | (11101100) | (8) | (12) |
| 0111110 | (1) | (0) | | 10000011 | (11101101) | (8) | (33) |
| 0111111 | (1) | (0) | | 10000100 | (11101110) | (8) | (13) |
| 1000000 | (3) | (8) | | 10000101 | (11101111) | (8) | (41) |
| 1000001 | (3) | (8) | | 10000110 | (11110000) | (8) | (27) |
| ~ | ~ | ~ | | 10000111 | (11110001) | (8) | (20) |
| 1001110 | (3) | (8) | | 10001000 | (11110010) | (8) | (4) |
| 1001111 | (3) | (8) | | 10001001 | (11110011) | (8) | (32) |
| 1010000 | (3) | (1) | | 10001010 | (111101000) | (9) | (34) |
| 1010001 | (3) | (1) | | 10001011 | (111101001) | (9) | (21) |
| ~ | ~ | ~ | | 10001100 | (111101010) | (9) | (42) |
| 1011110 | (3) | (1) | | 10001101 | (111101011) | (9) | (5) |
| 1011111 | (3) | (1) | | 10001110 | (111101100) | (9) | (49) |
| 1100000 | (4) | (9) | | 10001111 | (111101101) | (9) | (40) |
| 1100001 | (4) | (9) | | 10010000 | (111101110) | (9) | (14) |
| ~ | ~ | ~ | | 10010001 | (111101111) | (9) | (35) |
| 1100110 | (4) | (9) | | 10010010 | (111110000) | (9) | (29) |
| 1100111 | (4) | (9) | | 10010011 | (111110001) | (9) | (28) |
| 1101000 | (6) | (17) | | 10010100 | (111110010) | (9) | (43) |
| 1101001 | (6) | (17) | | 10010101 | (111110011) | (9) | (22) |
| 1101010 | (6) | (10) | | 10010110 | (111110100) | (9) | (50) |
| 1101011 | (6) | (10) | | 10010111 | (111110101) | (9) | (15) |
| 1101100 | (6) | (16) | | 10011000 | (1111101100) | (10) | (30) |
| 1101101 | (6) | (16) | | 10011001 | (1111101101) | (10) | (6) |
| 1101110 | (6) | (2) | | 10011010 | (1111101110) | (10) | (48) |
| 1101111 | (6) | (2) | | 10011011 | (1111101111) | (10) | (36) |
| 1110000 | (7) | (25) | | 10011100 | (1111110000) | (10) | (57) |
| 1110001 | (7) | (11) | | 10011101 | (1111110001) | (10) | (37) |
| 1110010 | (7) | (18) | | 10011110 | (1111110010) | (10) | (58) |
| 1110011 | (7) | (24) | | 10011111 | (1111110011) | (10) | (44) |
| 1110100 | (7) | (3) | | 10100000 | (1111110100) | (10) | (51) |
| 1110101 | (15) | (—) | | 10100001 | (1111110101) | (10) | (23) |
| 1110110 | (15) | (—) | | 10100010 | (1111110110) | (10) | (59) |
| 1110111 | (15) | (—) | | 10100011 | (1111110111) | (10) | (52) |
| 1111000 | (15) | (—) | | 10100100 | (11111111000) | (10) | (45) |
| 1111001 | (15) | (—) | | 10100101 | (11111111001) | (10) | (38) |
| 1111010 | (15) | (—) | | 10100110 | (11111111010) | (10) | (31) |
| 1111011 | (15) | (—) | | 10100111 | (11111111011) | (10) | (56) |
| 1111100 | (15) | (—) | | 10101000 | (11111111100) | (11) | (7) |
| 1111101 | (15) | (—) | | 10101001 | (11111111101) | (11) | (53) |
| 1111110 | (15) | (—) | | 10101010 | (11111111110) | (11) | (46) |
| 1111111 | (15) | (—) | | 10101011 | (11111111111) | (11) | (60) |
| | | | | 10101100 | (111111111100) | (11) | (39) |
| | | | | 10101101 | (111111111101) | (11) | (47) |
| | | | | 10101110 | (111111111110) | (11) | (61) |
| | | | | 10101111 | (111111111111) | (12) | (62) |
| | | | | 10110000 | (111111111111) | (12) | (54) |
| | | | | 10110001 | (111111111111) | (12) | (55) |
| | | | | 10110010 | (111111111111) | (12) | (63) |

Processing by first decoder

Processing by second decoder
i is the numbering of rows

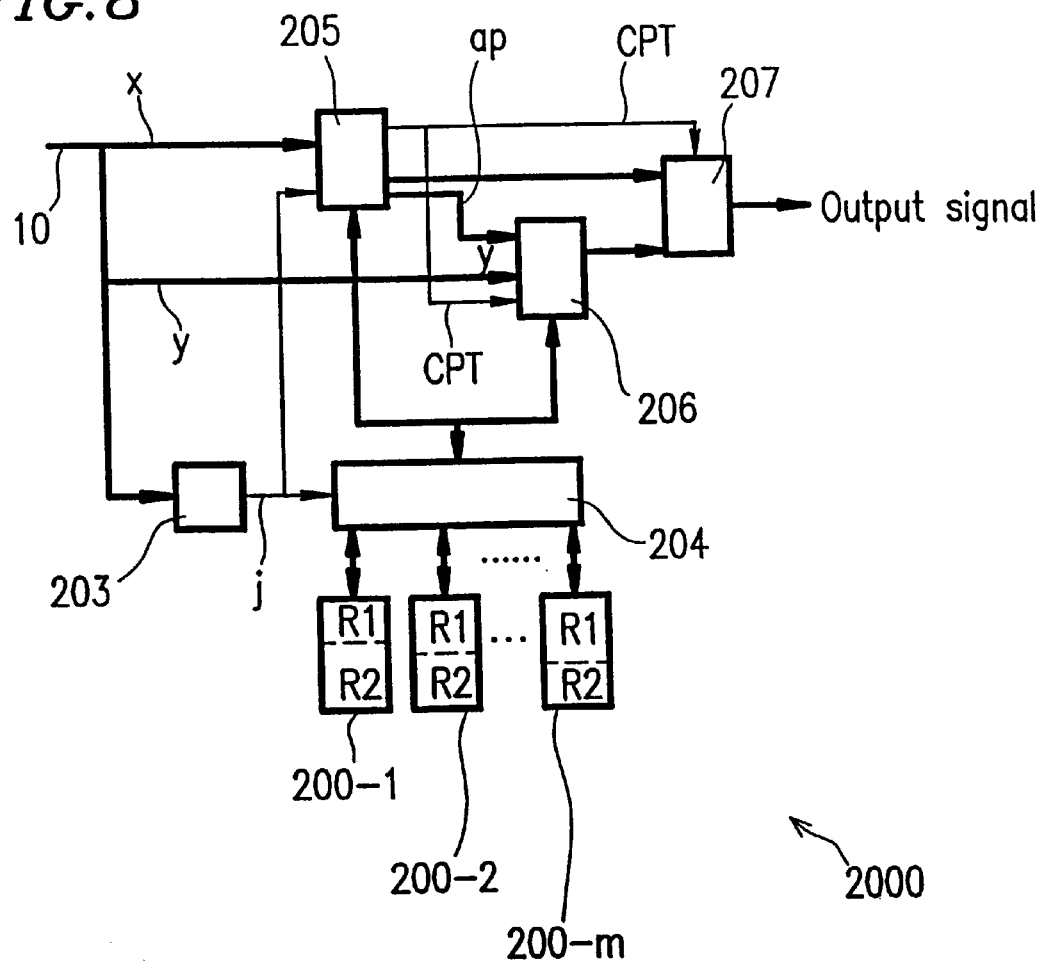

FIG.10

| Address column | Data column | |
|---|---|---|
| | First field (code length) | Second field (result of decoding) |
| 0000000 | (1) | (0) |
| 0000001 | (1) | (0) |
| 0111110 | (1) | (0) |
| 0111111 | (1) | (0) |
| 1000000 | (3) | (8) |
| 1000001 | (3) | (8) |
| 1001110 | (3) | (8) |
| 1001111 | (3) | (8) |
| 1010000 | (3) | (1) |
| 1010001 | (3) | (1) |
| 1011110 | (3) | (1) |
| 1011111 | (3) | (1) |
| 1100000 | (4) | (9) |
| 1100001 | (4) | (9) |
| 1100110 | (4) | (9) |
| 1100111 | (4) | (9) |
| 1101000 | (6) | (17) |
| 1101001 | (6) | (17) |
| 1101010 | (6) | (10) |
| 1101011 | (6) | (10) |
| 1101100 | (6) | (16) |
| 1101101 | (6) | (16) |
| 1101110 | (6) | (2) |
| 1101111 | (6) | (2) |
| 1110000 | (7) | (25) |
| 1110001 | (7) | (11) |
| 1110010 | (7) | (18) |
| 1110011 | (7) | (24) |
| 1110100 | (7) | (3) |
| 1110101 | (15) | (b'10000000) |
| 1110110 | (15) | (b'10000010) |
| 1110111 | (15) | (b'10000100) |
| 1111000 | (15) | (b'10000110) |
| 1111001 | (15) | (b'10001010) |
| 1111010 | (15) | (b'10001110) |
| 1111011 | (15) | (b'10010010) |
| 1111100 | (15) | (b'10010110) |
| 1111101 | (15) | (b'10011100) |
| 1111110 | (15) | (b'10100100) |
| 1111111 | (15) | (b'10100100) |

| Address column | Data column | | |
|---|---|---|---|
| | Third field (Huffman code) | Fourth field (code length) | Fifth field (result of decoding) |
| 10000000 | 1110101 0 | 1 | (19) |
| 10000001 | 1110101 1 | 1 | (26) |
| 10000010 | 1110110 0 | 1 | (12) |
| 10000011 | 1110110 1 | 1 | (33) |
| 10000100 | 1110111 0 | 1 | (13) |
| 10000101 | 1110111 1 | 1 | (41) |
| 10000110 | 1111000 0 | 1 | (27) |
| 10000111 | 1111000 1 | 1 | (20) |
| 10001000 | 1111001 0 | 1 | (4) |
| 10001001 | 1111001 1 | 1 | (32) |
| 10001010 | 1111010 00 | 2 | (34) |
| 10001011 | 1111010 01 | 2 | (21) |
| 10001100 | 1111010 10 | 2 | (42) |
| 10001101 | 1111010 11 | 2 | (5) |
| 10001110 | 1111011 00 | 2 | (49) |
| 10001111 | 1111011 01 | 2 | (40) |
| 10010000 | 1111011 10 | 2 | (14) |
| 10010001 | 1111011 11 | 2 | (35) |
| 10010010 | 1111100 00 | 2 | (29) |
| 10010011 | 1111100 01 | 2 | (28) |
| 10010100 | 1111100 10 | 2 | (43) |
| 10010101 | 1111100 11 | 2 | (22) |
| 10010110 | 1111101 00 | 2 | (50) |
| 10010111 | 1111101 01 | 2 | (15) |
| 10011000 | 1111101 100 | 3 | (30) |
| 10011001 | 1111101 101 | 3 | (6) |
| 10011010 | 1111101 110 | 3 | (48) |
| 10011011 | 1111101 111 | 3 | (36) |
| 10011100 | 1111110 000 | 3 | (57) |
| 10011101 | 1111110 001 | 3 | (37) |
| 10011110 | 1111110 010 | 3 | (58) |
| 10011111 | 1111110 011 | 3 | (44) |
| 10100000 | 1111110 100 | 3 | (51) |
| 10100001 | 1111110 101 | 3 | (23) |
| 10100010 | 1111110 110 | 3 | (59) |
| 10100011 | 1111110 111 | 3 | (52) |
| 10100100 | 1111111 000 | 3 | (45) |
| 10100101 | 1111111 001 | 3 | (38) |
| 10100110 | 1111111 010 | 3 | (31) |
| 10100111 | 1111111 011 | 3 | (56) |
| 10101000 | 1111111 0111 | 4 | (7) |
| 10101001 | 1111111 1000 | 4 | (53) |
| 10101010 | 1111111 1001 | 4 | (46) |
| 10101011 | 1111111 1010 | 4 | (60) |
| 10101100 | 1111111 1011 | 4 | (39) |
| 10101101 | 1111111 1100 | 4 | (47) |
| 10101110 | 1111111 1101 | 4 | (61) |
| 10101111 | 1111111 1100 | 5 | (62) |
| 10110000 | 1111111 1101 | 5 | (54) |
| 10110001 | 1111111 1110 | 5 | (55) |
| 10110010 | 1111111 1111 | 5 | (63) |

FIG. 11

| Input value | Huffman code | Code length |
|---|---|---|
| 0 | 01110 | 5 |
| 1 | 0101 | 4 |
| 2 | 10000 | 5 |
| 3 | 110000 | 6 |
| 4 | 1101111 | 7 |
| 5 | 11110001 | 8 |
| 6 | 111111010 | 9 |
| 7 | 1111111110 | 10 |
| 8 | 0011 | 4 |
| 9 | 000 | 3 |
| 10 | 0100 | 4 |
| 11 | 10010 | 5 |
| 12 | 101100 | 6 |
| 13 | 1101010 | 7 |
| 14 | 1110101 | 7 |
| 15 | 11111000 | 8 |
| 16 | 01111 | 5 |
| 17 | 0010 | 4 |
| 18 | 0110 | 4 |
| 19 | 10100 | 5 |
| 20 | 101110 | 6 |
| 21 | 1101001 | 7 |
| 22 | 1110010 | 7 |
| 23 | 11110101 | 8 |
| 24 | 101111 | 6 |
| 25 | 10001 | 5 |
| 26 | 10011 | 5 |
| 27 | 101010 | 6 |
| 28 | 110010 | 6 |
| 29 | 1101100 | 7 |
| 30 | 1110100 | 7 |
| 31 | 11111010 | 8 |
| 32 | 1110001 | 7 |
| 33 | 101011 | 6 |
| 34 | 101101 | 6 |
| 35 | 11000 | 5 |
| 36 | 101101 | 6 |
| 37 | 1110000 | 7 |
| 38 | 11110010 | 8 |
| 39 | 111111001 | 9 |
| 40 | 1101111 | 7 |
| 41 | 101000 | 6 |
| 42 | 110011 | 6 |
| 43 | 1101011 | 7 |
| 44 | 1101110 | 7 |
| 45 | 11101110 | 8 |
| 46 | 11111001 | 8 |
| 47 | 1111111100 | 10 |
| 48 | 1111000 | 7 |
| 49 | 110100 | 6 |
| 50 | 110011 | 6 |
| 51 | 1101101 | 7 |
| 52 | 11110000 | 8 |
| 53 | 11100110 | 8 |
| 54 | 111100110 | 9 |
| 55 | 111111101 | 9 |
| 56 | 1111111101 | 10 |
| 57 | 111110011 | 9 |
| 58 | 11100100 | 8 |
| 59 | 11110011 | 8 |
| 60 | 111101011 | 9 |
| 61 | 111111011 | 9 |
| 62 | 1111111100 | 10 |
| 63 | 1111111111 | 10 |

PRIOR ART

FIG. 12

| Huffman code | Code length | Result of decoding |
|---|---|---|
| 000 | 3 | 9 |
| 0010 | 4 | 17 |
| 0011 | 4 | 8 |
| 0100 | 4 | 10 |
| 0101 | 4 | 1 |
| 0110 | 4 | 18 |
| 01110 | 5 | 0 |
| 01111 | 5 | 16 |
| 10000 | 5 | 2 |
| 10001 | 5 | 25 |
| 10010 | 5 | 11 |
| 10011 | 5 | 26 |
| 10100 | 5 | 19 |
| 101010 | 6 | 27 |
| 101011 | 6 | 33 |
| 101100 | 6 | 12 |
| 101101 | 6 | 34 |
| 101110 | 6 | 20 |
| 101111 | 6 | 24 |
| 110000 | 6 | 3 |
| 110001 | 6 | 35 |
| 110010 | 6 | 28 |
| 110011 | 6 | 42 |
| 1101000 | 7 | 41 |
| 1101001 | 7 | 21 |
| 1101010 | 7 | 13 |
| 1101011 | 7 | 43 |
| 1101100 | 7 | 29 |
| 1101101 | 7 | 36 |
| 1101110 | 7 | 44 |
| 1101111 | 7 | 4 |
| 1110000 | 7 | 37 |
| 1110001 | 7 | 32 |
| 1110010 | 7 | 22 |
| 1110011 | 7 | 50 |
| 1110100 | 7 | 49 |
| 11101010 | 8 | 14 |
| 11101011 | 8 | 30 |
| 11101100 | 8 | 51 |
| 11101101 | 8 | 45 |
| 11101110 | 8 | 40 |
| 11101111 | 8 | 52 |
| 11110000 | 8 | 5 |
| 11110001 | 8 | 38 |
| 11110010 | 8 | 57 |
| 11110011 | 8 | 58 |
| 11110100 | 8 | 23 |
| 11110101 | 8 | 53 |
| 11110110 | 8 | 59 |
| 11110111 | 8 | 15 |
| 11111000 | 8 | 46 |
| 11111001 | 8 | 31 |
| 11111010 | 8 | 54 |
| 111110110 | 9 | 60 |
| 111110111 | 9 | 48 |
| 111111000 | 9 | 39 |
| 111111001 | 9 | 6 |
| 111111010 | 9 | 61 |
| 111111011 | 9 | 62 |
| 111111100 | 9 | 55 |
| 111111101 | 9 | 47 |
| 1111111100 | 10 | 56 |
| 1111111101 | 10 | 7 |
| 1111111110 | 10 | 63 |

PRIOR ART

DECODING DEVICE

BACKGROUND OF THE INVENTION

1. Field of the Invention

The present invention relates to a decoding device for decoding a data stream, and more particularly to a decoding device for decoding a data stream containing Huffman-encoded data.

2. Description of the Related Art

Recently, decoding devices for decoding a Huffman-encoded bit stream (data stream) have been widely developed. Decoding methods used in such decoding devices are generally categorized into two types. One type focuses on saving memory. The other type focuses on increasing decoding speed. An encoding method will be initially described before describing such decoding methods.

FIG. 11 shows an example of a Huffman encoding book 1100 used in Huffman encoding. The left column 1101 of the Huffman encoding book 1100 indicates input values to be Huffman-encoded. In the example shown in FIG. 11, the input values range from 0 through 63. The middle column 1102 of the Huffman encoding book 1100 indicates Huffman codes corresponding to the respective input values. The right column 1103 of the Huffman encoding book 1100 indicates a code length corresponding to the respective Huffman codes. In Huffman encoding, the higher the frequency of occurrence of an input value, the shorter the Huffman code which is assigned to the input value. Conversely, the lower the frequency of occurrence of an input value, the longer the Huffman code which is assigned to the input value.

For example, the first row 1104 of the Huffman encoding book 1100 indicates that a Huffman code (01110) is assigned to an input value 0, and the code length of the Huffman code is 5 bits. An encoding device receives and encodes an input value 0 and outputs the resulting Huffman code (01110). The encoding device does not need to output information indicating the code length of the Huffman code along with the Huffman code. This is because any code which has the same digit sequence beginning from the leftmost digit of a Huffman code (01110) but is shorter than the Huffman code (01110) cannot be included in the Huffman encoding book 1100. All the other Huffman codes which have a code length of five or more do not contain the Huffman code (01110) as a digit sequence beginning with the leftmost digit of the other Huffman codes. Accordingly, when a decoding device decodes the Huffman code (01110), the decoding device does not need information specifically indicating that the code length of the Huffman code (01110) is 5 bits. Thus, a Huffman code (01110) itself can include information indicating which input value (0) the Huffman code corresponds to and information indicating the code length (5) of the Huffman code.

For that reason, Huffman codes can be generated in a contiguous way to produce a bit stream which is then output from the encoding device.

Hereinafter, a conventional decoding method focusing on saving memory will be described. FIG. 12 shows a decoding table 1200 used for decoding data encoded with the Huffman encoding book 1100 shown in FIG. 11. The decoding table 1200 is obtained by rearranging the rows of the Huffman encoding book 1100 shown in FIG. 11 in order of the code length of the Huffman code from the shortest. The left column 1102A of the decoding table 1200 indicates Huffman codes. The middle column 1103A indicates the code length of the Huffman codes. The right column 1201 indicates the results of decoding the Huffman codes. As is seen from FIG. 12, a Huffman code having a code length of three bits (000) on the first row 1202 is the shortest Huffman code. The result from decoding the Huffman code (000) is "9" which corresponds to the tenth row 1105 (input value "9") of the Huffman encoding book 1100 shown in FIG. 11.

As is also seen from FIG. 12, a Huffman code (1111111111) with 10 bits on the lowest row 1203 is one of the longest Huffman codes. The result from decoding the Huffman code (1111111111) is "63" which corresponds to the 64th row 1106 (input value "63") of the Huffman encoding book 1100 shown in FIG. 11.

Huffman decoding in a decoding device using the decoding table 1200 will be described below.

The first row 1202 (the uppermost row) of the decoding table 1200 indicates that the code length is three. Based on this code length, a first three bits are read out of a bit stream. The decoding device determines whether the first three bits of data of the bit stream match the Huffman code (000) on the first row 1202.

If the matching is successful (i.e., a match is found), the decoding device outputs "9" as the result of the decoding, and shifts a reading position in the bit stream by three bits. One Huffman-decoding operation is thus finished.

If the matching is not successful, a next row 1204 of the decoding table 1200 is considered. The second row 1204 has a code length of four. Accordingly, an additional one bit (1=4−3) next to the three bits which already have been read out is read out of the bit stream.

It is then determined whether the four bit data thus read matches a Huffman code (0010) on the second row 1204.

If the matching is successful, "17" is output as the result of the decoding. The reading position of the bit stream is shifted by one bit. One Huffman-decoding operation is thus finished.

If the matching is not successful, a next row 1205 of the decoding table 1200 is looked up. The third row 1205 has a code length of four. Accordingly, no new bit is read out of the bit stream. It is then determined whether the four bit data thus currently read matches the Huffman code (0011) on the third row 1205.

In this way, the matching procedure is repeated until data which is sequentially read out of the bit stream matches any of the Huffman codes contained in the decoding table 1200. When the decoding device finds a row having a Huffman code matching the data, the decoding device outputs the value on the right column of the row as the result of the decoding operation.

The decoding table used in the above-described decoding method is very small in size. This is because such a decoding table only needs the same number of rows as that of input values (0 to 63). In the decoding method, however, the decoding table is accessed many times in the matching procedure until a matching Huffman code is found. This requires considerable processing time.

Next, a conventional decoding method focusing on increasing decoding speed will be described below.

FIG. 13 shows a decoding table 1300 used in decoding data which has been encoded using the Huffman encoding book 1100 shown in FIG. 11. An example of the decoding method represented in FIG. 13 uses addresses having a ten-bit width. The bit width (10 bits) of the addresses corresponds to the maximum code length (10 bits) of the Huffman codes in the Huffman encoding book 1100 shown in FIG. 11.

A decoding device reads 10-bit data out of a bit stream and accesses the decoding table 1300 using the 10-bit data as an address. In the decoding table 1300, an area 1301 including addresses (0000000000) through (0001111111) describes that a code length is three and the result of the decoding operation is "9". The 10-bit data in which the first three bits are a Huffman code (000) is necessarily among the addresses (0000000000) through (0001111111). The Huffman code (000) corresponds to the value "9". In this case, the decoding device outputs "9" as the result of the decoding corresponding to the first three bits (000) based on the decoding table 1300 shown in FIG. 13. The area 1301 indicates that the code length is three. Accordingly, the decoding device shifts a reading position by three bits and reads 10-bit data from the reading position. The decoding table 1300 shown in FIG. 13 is accessed using the 10-bit data as an access. Thus, the next Huffman decoding operation is performed.

The above-described decoding method can achieve high speed. Each Huffman decoding operation is finished by one access to the decoding table. However, the decoding method focusing on increasing decoding speed requires a vast-size decoding table compared with the decoding method focusing on saving memory.

As described above, the decoding method focusing on saving memory requires much processing time. The decoding method focusing on increasing decoding speed requires a large decoding table and therefore cannot achieve memory savings.

For example, recent audio decoding devices in conformity with the MPEG2-AAC standard need to decode Huffman codes which are encoded using twelve different Huffman code books. In this case, if all he Huffman encoding books are provided with decoding tables for high-speed decoding as shown in FIG. 13, a vast amount of memory is required. On the other hand, the MPEG2-AAC standard requires multiple channels and hi-fi audio with a high sampling rate. The use of decoding table for saving memory as shown in FIG. 12 requires vast processing performance.

SUMMARY OF THE INVENTION

According to one aspect of the present invention, a decoding device for decoding a data stream includes a decoding table including a first region and a second region; a first decoder; and a second decoder. The first region defines a relationship between first data having a predetermined number of bits and a result of decoding a portion of the first data having bits smaller than or equal to the predetermined number. The second region defines a relationship between concatenated data obtained by concatenating the first data with second data having additional bits and a result of decoding the concatenated data. The first decoder reads the first data from the data stream; decodes the portion of the first data based on the first region; determines whether the decoding of the portion of the first data is completed or not; and when the decoding of the portion of the first data is completed, outputs a result of the decoding of the portion of the first data. When the decoding of the portion of the first data is not completed, the second decoder reads the second data out of the data stream; concatenates the first data with the second data to generate the concatenated data; decodes the concatenated data based on the second region; and outputs a result of the decoding of the concatenated data.

In one embodiment of this invention, the decoding device further includes a plurality of decoding tables; and a selector for selecting one of the plurality of decoding tables. The predetermined number which is a bit number of the first data corresponding to each of the plurality of decoding tables is predetermined in accordance with a frequency of selection for each of the plurality of decoding tables.

In one embodiment of this invention, the bit number of the first data corresponding to each of the plurality of decoding tables is predetermined in such a manner that a probability that the first decoder completes the decoding of the portion of the first data is equal to or greater than a predetermined probability.

In one embodiment of this invention, the first region includes a first field for describing the code length of the portion of the first data or a code indicating that the decoding of the portion of the first data is not completed; and a second field for describing a result of the decoding of the portion of the first data. The first region is accessed using the first data as an address. The second region includes a third field for describing the concatenated data; a fourth field for describing the code length of the concatenated data; and a fifth field for describing a result of the decoding the concatenated data.

According to another aspect of the present invention, a decoding device for decoding a data stream includes a decoding table including a first region and a second region; a first decoder; and a second decoder. The first region defines a relationship between first data having a predetermined number of bits and a result of decoding a portion of the first data having bits smaller than or equal to the predetermined number. The second region defines a relationship between second data having additional bits and a result of decoding concatenated data, and the concatenated data is obtained by concatenating the first data with the second data. The first decoder reads the first data from the data stream; decodes the portion of the first data based on the first region; determines whether the decoding of the portion of the first data is completed or not; when the decoding of the portion of the first data is completed, outputs a result of the decoding of the portion of the first data; and when the decoding of the portion of the first data is not completed, specifies an address of the second region. When the decoding of the portion of the first data is not completed, the second decoder reads the second data out of the data stream; and outputs a result of the decoding of the concatenated data based on the address specified by the first decoder and the second data.

In one embodiment of this invention, the decoding device further includes a plurality of decoding tables; and a selector for selecting one of the plurality of decoding tables. The bit number of the first data corresponding each of the plurality of decoding tables is predetermined in accordance with a frequency of selection for each of the plurality of decoding tables.

In one embodiment of this invention, the bit number of the first data corresponding to each of the plurality of decoding tables is predetermined in such a manner that a probability that the first decoder completes the decoding of the portion of the first data is equal to or greater than a predetermined probability.

In one embodiment of this invention, the first region includes a first field for describing the code length of the portion of the first data or a code indicating that the decoding of the portion of the first data is not completed; and a second field for describing a result of the decoding of the portion of the first data or a pointer specifying an address of the second region. The first region is accessed using the first data as an address. The second region includes a third field for describing the second data; a fourth field for describing the code length of the second data; and a fifth field for describing a result of the decoding the concatenated data.

In one embodiment of this invention, the first decoder specifies an address corresponding to the second data having the shortest length among a plurality of addresses relating to the first data.

In one embodiment of this invention, the data stream includes a plurality of Huffman codes. The first and second decoders decode the plurality of Huffman codes.

Hereinafter, functions of this invention will be described.

According to the decoding device of this invention, the portion of the first data included in the first data having the predetermined number of bits is decoded based on the first region of the decoding table. The first region of the decoding table describes the relationship between the first data and the result of the decoding of the portion of the first data. For this reason, the relatively short portion of the first data having bits smaller than or equal to a predetermined number is decoded by one table access. A relatively short code therefore can be decoded at high speed.

On the other hand, when the first data is not decoded, the second data is further read out. The second data is concatenated with the first data to generate concatenated data having bits greater than the predetermined number. This concatenated data is decoded based on the second region of the decoding table. This second region describes a relationship between the concatenated data and the result of the decoding of the concatenated data, thereby minimizing the size of a decoding table for decoding a long code having bits greater than the predetermined number.

As described above, when the predetermined number is properly selected, a short code is decoded at high speed, and the size of a decoding table for decoding a long code is minimized. The decoding device can carry out decoding at high speed while saving memory. In particular, when the decoding device of this invention is used for decoding a bit stream which has been Huffman-encoded, the decoding device can carry out decoding at high speed while saving memory since a short Huffman code has a high frequency of occurrence and a long Huffman code has a low frequency of occurrence.

Thus, the invention described herein makes possible the advantage of providing a decoding device which achieves both memory savings and high-speed processing and which can be used, for example, as an audio decoding device in conformity with the MPEG2-AAC encoding format.

These and other advantages of the present invention will become apparent to those skilled in the art upon reading and understanding the following detailed description with reference to the accompanying figures.

BRIEF DESCRIPTION OF THE DRAWINGS

FIG. 3 is a diagram showing a correspondence relationship between a frequency band and the number of spectra in the MPEG2-AAC encoding format.

FIG. 4 is a diagram showing a first decoding table according to Example 1 of the present invention.

FIG. 5 is a diagram showing a conventional decoding table relating to a second Huffman encoding book.

FIG. 6 is a diagram showing a second decoding table according to Example 1 of the present invention.

FIG. 8 is a diagram showing a configuration of a decoding device according to Example 2 of the present invention.

FIG. 10 is a diagram showing a second decoding table according to Example 2 of the present invention.

FIG. 11 is a diagram showing a first Huffman encoding book for use in Huffman encoding.

FIG. 12 is a diagram showing a decoding table for use in a conventional decoding system focusing on saving memory.

DESCRIPTION OF THE PREFERRED EMBODIMENTS

Hereinafter, examples of this invention will be described with reference to the accompanying drawings.

EXAMPLE 1

In Example 1, a description will be given of a decoding device for decoding a bit stream (data stream) in which Huffman encoding is carried out using a plurality of Huffman encoding books. The decoding device of Example 1 may be used as an audio decoding device in conformity with the MPEG2-AAC encoding format.

Before describing the decoding device of Example 1, a bit stream to be input to the decoding device of Example 1 will be explained.

Figure 2:
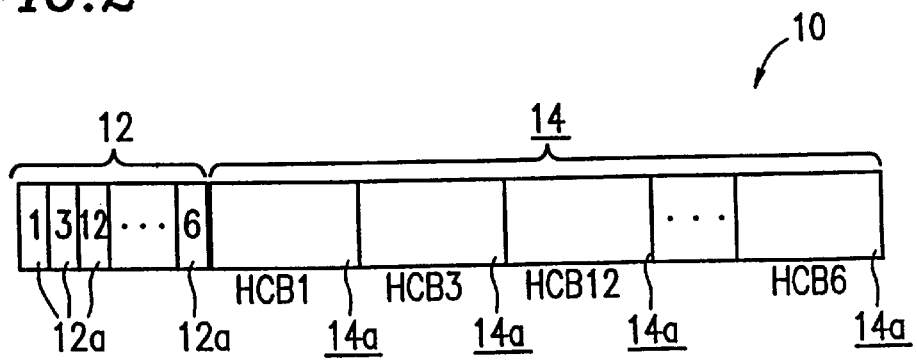
FIG. 2 is a diagram showing an example of a bit stream to be input to a decoding device according to the present invention.

FIG. 2 shows a structure of a bit stream 10 to be input to the decoding device of Example 1. The bit stream 10 includes an index portion 12 and a data portion 14 following the index portion 12 as shown in FIG. 2. The index portion 12 identifies which Huffman encoding book has been used by an encoding device in encoding input values. The data portion 14 includes a plurality of encoded input values (i.e., Huffman codes).

The index portion 12 includes a plurality of index numbers 12a. Each index number 12a corresponds to a Huffman encoding book which has been used in encoding input values. In the MPEG2-AAC encoding format, for example, the input values are encoded using twelve different Huffman encoding books numbered 1st through 12th. In this case, the index numbers 12a have a value ranging from 1 through 12 corresponding to the twelve Huffman encoding books.

The data portion 14 includes a plurality of data portions 14a. Each data portion 14a includes at least one input value (i.e., Huffman code) encoded using a Huffman encoding book identified by a corresponding index number 12a (HCB1, HCB3, HCB12, . . . , HCB6).

In the MPEG2-AAC encoding format, for example, in the bit stream 10, the index portion 12 includes 49 index numbers 12a and the data portion 14 includes 49 data portions 14a. Each data portion 14a, for example, includes four Huffman codes corresponding to four input values. The four Huffman codes included in this data portion 14a have been encoded using the same Huffman encoding book.

The above-described bit stream has such a structure because in the MPEG2-AAC encoding format, data to be transmitted is divided into 49 frequency bands, and a Huffman encoding book optimal for four spectra (four input values), for example, included in each frequency band is used. Also in the MPEG2-AAC encoding format, the bit stream 10 includes Huffman codes corresponding to a total of 1024 spectra (input values).

FIG. 3 shows a correspondence table 300 between frequency bands and the number of spectra in the case when 1024 spectra are included in 49 frequency bands in the MPEG2-AAC encoding format. In FIG. 3, the left column 301 indicates 49 frequency bands. The right column 302 indicates the number of spectra included in the frequency bands indicated on the left column 301.

A decoding device for decoding the bit stream 10 having the above-described structure will be described below.

Figure 1:
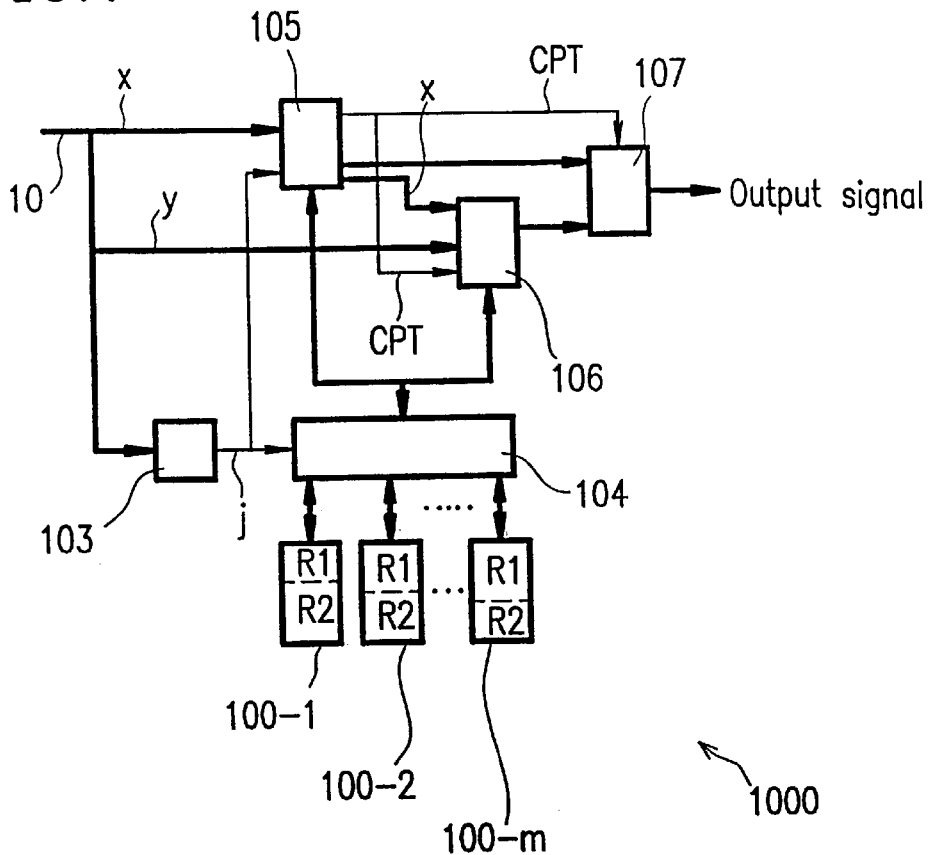
FIG. 1 is a diagram showing a configuration of a decoding device according to Example 1 of the present invention.

FIG. 1 shows a configuration of a decoding device 1000 according to Example 1 of this invention. The decoding device 1000 includes an index detecting device 103 for detecting the index numbers 12*a* in the bit stream 10; first through m-th decoding tables 100-1 through 100-m (where m is an arbitrary integer representing the number of tables included in the decoding device 1000), and a table selecting device 104 for choosing one of the first through m-th decoding tables 100-1 through 100-m.

The first through m-th decoding tables 100-1 through 100-m correspond to the respective Huffman encoding books used in encoding. In the MPEG2-AAC encoding format, for example, twelve Huffman encoding books are used, so that the decoding device 1000 may include a respective twelve decoding tables numbered as first through twelfth.

Each of the decoding tables 100-1 through 100-m includes a first region R1 and a second region R2. The first region R1 is pointed with an address having a predetermined bit width. The second region R2 is pointed with an address having a bit width exceeding the predetermined bit width. The decoding tables will be described later in detail.

The decoding device 1000 further includes a first Huffman decoder 105, a second Huffman decoder 106, and an output selecting device 107. The first Huffman decoder 105 decodes short Huffman codes having a bit number smaller than or equal to a predetermined number $N_j$ (where $N_j$ is an arbitrary integer defined by an index number j which is an arbitrary integer satisfying $1 \leq j \leq m$). The second Huffman decoder 106 decodes long Huffman codes having a bit number exceeding the predetermined number $N_j$. The output selecting device 107 selects and outputs the results of decoding by the first and second Huffman decoders 105 and 106.

The first Huffman decoder 105 determines the predetermined number $N_j$ based on an index number j output from the index detecting device 103, and reads data having the predetermined number $N_j$ of bits (hereinafter is referred to as predetermined bit number data x) out of the bit stream 10. When the predetermined bit number data x includes a relatively short Huffman code having a bit number smaller than or equal to the predetermined number $N_j$, the first Huffman decoder 105 decodes the short Huffman code using the first region R1 of the above-described decoding table.

On the other hand, when the first Huffman decoder 105 does not complete Huffman decoding, the second Huffman decoder 106 reads additional data y following the predetermined bit number data x out of the bit stream 10. The second Huffman decoder 106 concatenates the additional data y with the predetermined bit number data x to obtain concatenated data x|y, and decodes the concatenated data x|y using the second region R2 of the decoding table.

The above-described decoding device decodes a bit stream which has been encoded using a plurality of Huffman encoding books. Though when the bit stream has been encoded using a single Huffman encoding book, the index detecting device 103 and table selecting device 104 of the decoding device 1000 are not necessarily required as will be appreciated. Further, in such a case, only one decoding table corresponding to the single Huffman encoding book is necessary as will be appreciated.

As described above, the decoding device 1000 decodes a relatively short Huffman code (i.e., a Huffman code having a high frequency of occurrence) and a relatively long Huffman code (i.e., a Huffman code having a low frequency of occurrence) with different decoding processes. Hereinafter, a decoding table used in the decoding device 1000 of Example 1 will be described in detail.

Figure 4:
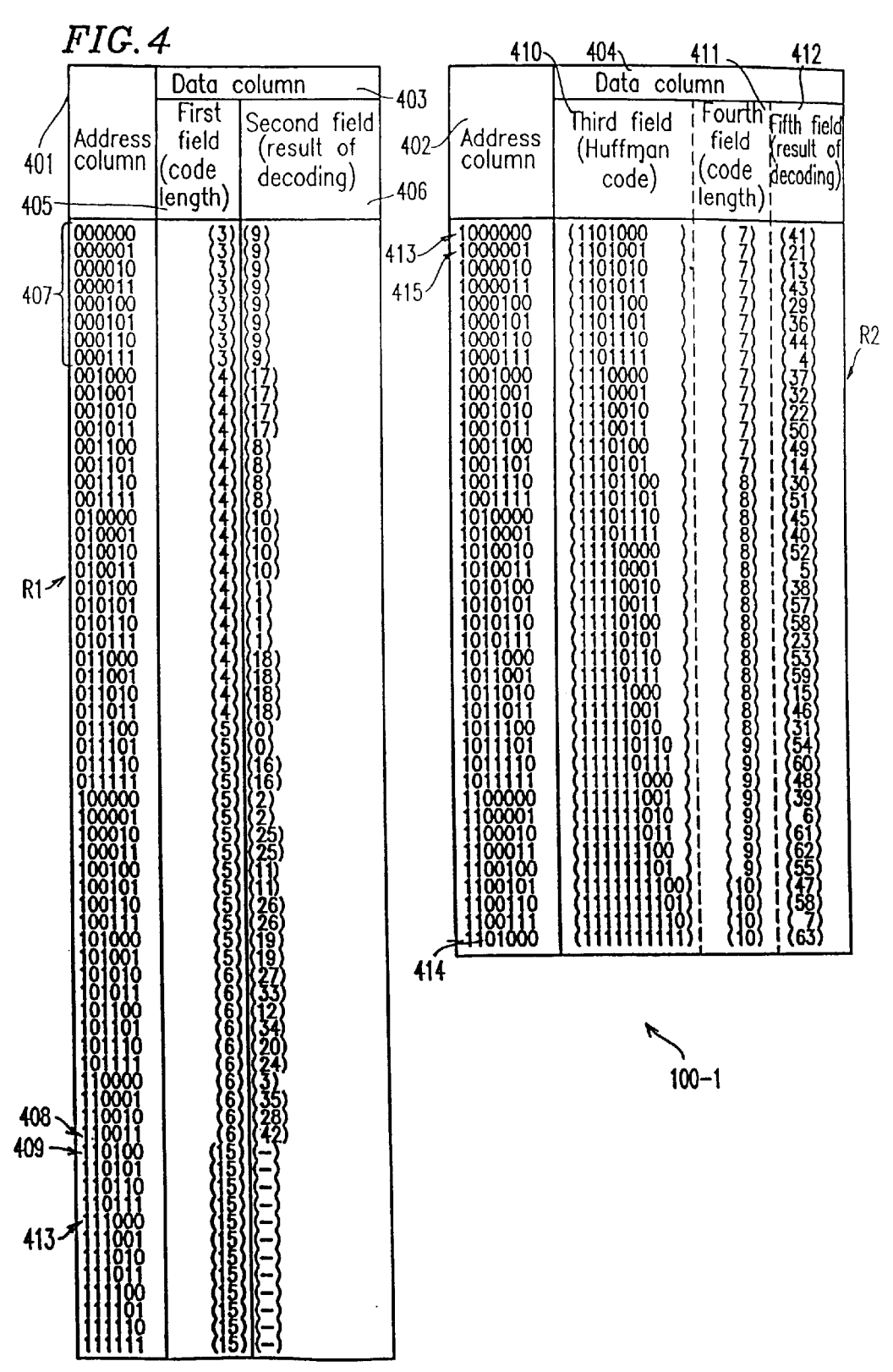

FIG. 4 shows the first decoding table 100-1. The first decoding table 100-1 is used for decoding a bit stream which has been encoded using the first Huffman encoding book which is identified with index number j (=1). In Example 1, to describe the decoding device 1000, the Huffman encoding book 1100 shown in FIG. 11 is used as the first Huffman encoding book.

As shown in FIG. 4, the first decoding table 100-1 includes the first region R1 and the second region R2. The first region R1 includes addresses having a width of six bits ranging from a 0th address (000000) through a 63th ($2^6-1$) address (111111). The second region R2 includes addresses having a width of seven bits ranging from a 64th address (1000000) through a 104th address (1101000).

The bit width of the addresses of the first region R1 is equal to the bit number of the predetermined bit number data x (i.e., predetermined number $N_j$) which is read out of the bit stream 10 by the first Huffman decoder 105. In Example 1, the bit width of the addresses in the first region R1 is six bits. When the first Huffman decoder 105 detects index number 1, the decoder 105 determines the predetermined number $N_1$ (j=1) as six. Accordingly, six-bit data is read out of the bit stream 10.

In the first decoding table 100-1 shown in FIG. 4, the first and second regions R1 and R2 have addresses on the left columns 401 and 402 (address columns) and data on the right columns 403 and 404 (data columns). The data columns 403 and 404 store data corresponding to each address.

The data column 403 of the first region R1 includes a first field 405 (the left column of the data column 403) and a second field 406 (the right column of the data column 403). The first field 405 stores the code length of Huffman codes to be decoded. Specifically, when the predetermined bit number data x has six bits, the first field 405 at address x of the first region R1 stores the length of L bits which are at the most significant bit (MSB) side of the six-bit data x and which correspond to a Huffman code included in the first Huffman encoding book (shown in FIG. 11), where L is an arbitrary integer satisfying $1 \leq L \leq 6$, representing code length. The second field 406 stores the result of decoding the Huffman code.

The first field 405, for example, stores the same value "3" at address (000000) through address (000111). The six-bit data (000000) through (000111) are all the possible data of six bits which include the Huffman code (000) at the MSB side thereof. The second field 406 stores the same value "9" at address (000000) through address (000111) where "9" is the result of decoding the Huffman code (000). An area 407 including address (000000) through address (000111) corresponds to the first row 1202 (i.e., a row corresponding to the Huffman code (000)) of the conventional decoding table 1200 (corresponding to the first Huffman encoding book) shown in FIG. 12.

Further, the first field 405, for example, stores a value "6" at address (110011). The second field 406 stores a value "42" at address (110011). The six-bit data (110011) is only possible data of six bits which includes the Huffman code (110011) at the MSB side thereof (i.e., the whole data (110011)). The result of decoding the Huffman code (110011) is "42". Accordingly, address (110011) 408 corresponds to the 23th row 1206 (i.e., a row corresponding to the Huffman code (110011)) of the decoding table 1200 shown in FIG. 12.

Further, the first field 405, for example, stores a value "15" exceeding "6" at address (110100) 409. This indicates that six-bit data (110100) does not complete a Huffman code. In Example 1, an integer "15" exceeding the predetermined number $N_1$ (=6) is stored. Any data maybe used so long as it can indicate that a six-bit data does not complete a Huffman code. Negative integers or symbols other than numerals, for example, may be used. Moreover, the second field 406 stores an incompleteness symbol (--). This is because the six-bit data (110100) does not complete a Huffman code and there is no result of a decoding operation. This incompleteness symbol may be any data that can be distinguished from the standard results of decoding. Address (110100) corresponds to 24th and 25th rows 1207 and 1208 of the decoding table 1200 shown in FIG. 12 (i.e., rows corresponding to Huffman codes (1101000) and (1101001)).

On the other hand, the second region R2 of the decoding table 100-1 includes addresses having a width of seven bits. The data column 404 of the second region R2 includes third, fourth, and fifth fields 410, 411, and 412. In FIG. 4, the left column of the data column 404 is the third field 410; the middle column the fourth field 411; and the right column the fifth field 412.

The third field 410 of the second region R2 stores Huffman codes included in the first Huffman encoding book 1100 (shown in FIG. 11) which have a code length of more than six. The fourth field 411 stores the code length of the Huffman codes. The fifth field 412 stores the results of decoding the Huffman codes. These stored data are stored at the 64th address 413 (address (1000000)) through 104th address 414 (address (1101000)) in order of increasing Huffman code length.

The third, fourth, and fifth fields 410, 411, and 412 at the 64th address 413 (address (1000000) which is the first row of the second region R2 of the decoding table 100-1, for example, store a Huffman code (1101000), a code length "7", and the result of a decoding operation "41", respectively. These stored data correspond to the content of the 24th row 1207 (i.e., a row corresponding to a Huffman code (1101000)) of the decoding table shown in FIG. 12. Following this, the 65th address 415 (address (1000001)) through 104th address 414 (address (1101000)) store the respective contents of the 25th row 1208 (i.e., a row corresponding to a Huffman code (1101001)) through the 64th row 1203 (i.e., a row corresponding to a Huffman code (1111111111)) of the decoding table shown in FIG. 12.

Next, the second decoding table 100-2 will be described. The second decoding table 100-2 has a structure similar to that of the above-described first decoding table 100-1.

FIG. 6 shows the second decoding table 100-2. The decoding table 100-2 is used for decoding Huffman codes which have been encoded using a second Huffman encoding book corresponding to index number 2.

FIG. 5 shows a conventional decoding table 500 obtained by rearranging the rows of the second Huffman encoding book (not shown) in order of increasing Huffman code length. The left column 501 of the decoding table 500 indicates Huffman codes. The middle column 502 indicates the code length of the Huffman codes. The right column 503 indicates the results of decoding the Huffman codes.

As is seen from FIG. 6, the second decoding table 100-2 includes the first region R1 and the second region R2. The first region R1 includes addresses having a width of seven bits ranging from a 0th address 601 (0000000) through a 127th (=$2^7$–1) address 602 (1111111). The second region R2 includes addresses having a width of eight bits ranging from a 128th address 603 (10000000) through a 178th address 619 (10110010).

The bit width of the addresses of the first region R1 is equal to the bit number of data (i.e., predetermined number $N_2$) which is read out of a bit stream by the first Huffman decoder 105 when the detected index number j is two. In the second decoding table 100-2 of Example 1, the bit width of the addresses in the first region R1 is seven bits.

Similar to the first decoding table 100-1, in the second decoding table 100-2, the data column 606 of the first region R1 includes a first field 607 and a second field 608. The data column 610 of the second region R2 includes third, fourth, and fifth fields 611, 612, and 613.

Assuming that x' is data having seven bits, the first field 607 at address x' of the first region R1 stores the length of L bits which are at the MSB side of the seven-bit data (address) x' and which correspond to a Huffman code included in the second Huffman encoding book where L is an arbitrary integer satisfying 1≦L≦7, representing code length). The second field 608 stores the results of decoding the Huffman codes.

The first field 607, for example, stores the same value "1" at address 601 (0000000) through address 614 (0111111). The second field 608 stores the same value "0" at address 601 (0000000) through address 614 (0111111). The seven-bit data (0000000) through (0111111) are all the possible data of seven bits which include a Huffman code (0) at the MSB side thereof. "0" is the result of decoding the Huffman code (0). Address 601 (0000000) through address 614 (0111111) correspond to the first row 504 (i.e., a row corresponding to the Huffman code (0)) of the decoding table 500 shown in FIG. 5.

Further, the first field 607, for example, stores a value "7" at address 615 (1110100). The second field 608 stores a value "3" at address 615 (1110100). The most significant seven bits of the seven-bit data (1110100) (i.e., the whole data (1110100)) completes a Huffman code (1110100). The result of decoding the Huffman code (1110100) is "3". Accordingly, address 615 (1110100) corresponds to the 13th row 505 (i.e., a row corresponding to the Huffman code (1110100)) of the decoding table 500 shown in FIG. 5.

Further, the first field 607, for example, stores a value "15" exceeding "7" at address 616 (1110101). This indicates that seven-bit data (1110101) does not complete a Huffman code. Similar to the first decoding table 100-1, negative integers or symbols other than numerals may be used as such a value. Moreover, the second field 608 stores an incompleteness symbol (--). This is because there is no result of decoding the seven-bit data (1110101). Similar to the first decoding table 100-1, this incompleteness symbol may be any data that can be distinguished from the results of decoding. Address 616 (110101) corresponds to 14th and 15th rows 506 and 507 of the decoding table 500 shown in FIG. 5 (i. e., rows corresponding to Huffman codes (11101010) and (11101011)).

In the decoding table 100-2 shown in FIG. 6, the third field 611 (the left column of the data column 610) of the second region R2 stores Huffman codes included in the second Huffman encoding book which have a code length of more than seven. The fourth field 612 (the middle column of the data column 610) stores the code length of the Huffman codes. The fifth field 613 (the right column of the data column 610) stores the results of decoding the Huffman codes. These stored data are stored at the 128th address 603 (address (10000000)) through the 178th address 619 (address (10110010)) in order of increasing Huffman code length.

The third, fourth, and fifth fields 611, 612, and 613 at the 128th address (address 603 (10000000) which is the first row of the second region R2 of the second decoding table 100-2, for example, store a Huffman code (11101010), a code length "8", and the result of a decoding operation "19", respectively. These stored data correspond to the content of the 14th row (i.e., a row 506 corresponding to a Huffman code (11101010)) of the decoding table 500 shown in FIG. 5. Following this, the 129th address (address 604 (10000001)) through 178th address 619 (address (10110010)) store the respective contents of the 15th row (i.e., a row corresponding to a Huffman code (11101011)) through the 64th row (i.e., a row corresponding to a Huffman code (111111111111)) of the decoding table 500 shown in FIG. 5.

The decoding device 1000 of Example 1 has still more decoding tables depending on the number of Huffman encoding books used for encoding. These decoding tables may also include first and second regions R1 and R2, similar to the above-described decoding tables 100-1 and 100-2. The address width of the first region R1 can be defined independently for each of the decoding tables. A decoding table may not include the second region R2. How to determine the address width of the decoding tables will be described later.

Hereinafter, the operation of the decoding device 1000 of Example 1 using the above-described decoding tables will be described.

Returning to FIG. 1, the bit stream 10 which has been Huffman-encoded is input to the index detecting device 103, the first Huffman decoder 105 and the second Huffman decoder 106. In FIG. 1, thick-line arrows indicate the flow of data, and thin-line arrows the flow of control signals.

The index detecting device 103 detects an index number j from the bit stream 10 (shown in FIG. 2) and outputs index number j to the table selecting device 104 (where j is an arbitrary integer satisfying $1 \leq j \leq m$; and m is an arbitrary integer representing the number of decoding tables included in the decoding device 1000). The table selecting device 104 chooses a j-th decoding table based on the received index number j. For example, when the index number detected by the index detecting device 103 is "1", the table selecting device 104 chooses the first decoding table 100-1.

The index detecting device 103 also outputs index number j to the first Huffman decoder 105. The first Huffman decoder 105 determines a predetermined number $N_j$ representing the number of bits of data to be read out of the bit stream 10, based on index number j (where $N_j$ is an arbitrary integer determined by j). The value of the predetermined number $N_j$ is determined to be equal to the address width of the first region R1 in the j-th decoding table selected by the table selecting device 104. For example, when the detected index number j is "1", the first Huffman decoder 105 determines that the predetermined number $N_1$ is "6". This value is equal to the address width of the first region R1 of the first decoding table 100-1. In Example 1, the relationship between index number j and the predetermined number $N_j$ is predetermined in the first Huffman decoder 105. For this reason, the first Huffman decoder 105 can determine the predetermined number $N_j$ based on the received index number j. A method for determining the predetermined number $N_j$ based on the received index number j is not limited to this. An alternative means for determining the predetermined number $N_j$ based on the received index number j may be provided outside the first Huffman decoder 105.

The first Huffman decoder 105 then reads predetermined bit number data x having $N_j$ bits out of the bit stream 10 in accordance with the predetermined number $N_j$. The predetermined bit number data x read out is then Huffman-decoded using the first region R1 of the j-th decoding table selected by the table selecting device 104. Specifically, the first Huffman decoder 105 carries out decoding by comparing the predetermined bit number data x having $N_j$ bits read out with the address having a width of $N_j$ bits included in the first region R1.

The first Huffman decoder 105 decodes relatively short Huffman codes having a bit number smaller than or equal to the predetermined number $N_j$ which may be included in the predetermined bit number data x having $N_j$ bits. This is because the first region R1 of the decoding table defines the relationship between the predetermined bit number data x and the results of decoding Huffman codes included in the predetermined bit number data x. For data including a short code, one access to the decoding table is sufficient. Therefore, decoding such a short Huffman code is carried out at a fast speed.

As described above, when a relatively short Huffman code has been decoded, the first Huffman decoder 105 outputs a completion signal CPT representing that one Huffman decoding operation is completed using the predetermined bit number data x (i.e., a completion signal having the value "true") to the second Huffman decoder 106 and the output selecting device 107. The first Huffman decoder 105 also outputs the result of the decoding to the output selecting device 107.

On the other hand, when the predetermined bit number data x having $N_j$ bits is not completely decoded, the first Huffman decoder 105 outputs a completion signal CPT representing that the decoding is not completed (i.e., a completion signal having the value "false") to the second Huffman decoder 106 and the output selecting device 107. The first Huffman decoder 105 also outputs the predetermined bit number data x having $N_j$ bits read out to the second Huffman decoder 106.

The second Huffman decoder 106 reads out additional data y following the predetermined bit number data x out of the bit stream 10 when the above-described completion signal is "false". The second Huffman decoder 106 concatenates the additional data y with the predetermined bit number data x received from the first Huffman decoder 105 to generate a concatenated data x|y (bit concatenation). The second Huffman decoder 106 Huffman-decodes the concatenated data x|y using the second region R2 of the j-th table, and outputs the result of the decoding to the output selecting device 107. Specifically, the second Huffman decoder 106 carries out a matching test in which the concatenated data x|y is compared with the Huffman codes described in the third field 410 of the second region R2. This matching test is repeated in order of address until the concatenated data x|y matches any of the Huffman codes included in the second region R2. In this process, additional data is successively read out if necessary.

The second Huffman decoder 106 decodes a relatively long Huffman code having bits greater than the predetermined number $N_j$. This is because the second region R2 of the decoding table defines the relationship between the concatenated data in which the additional data is concatenated with the predetermined bit number data, and the result of decoding the concatenated data. The second region R2 defining the relationship is equal to or smaller than an address space having the same number of rows as the number of Huffman codes to be decoded. Therefore, it is possible to reduce the overall size of a decoding table.

The output selecting device 107 outputs the result of a decoding operation received from the first Huffman decoder 105 as an output signal when the completion signal is "true", and outputs the result of a decoding operation received from the second Huffman decoder 106 as an output signal when the completion signal is "false". Thus, one Huffman decoding operation is completed.

Thereafter, the Huffman decoding device 1000 repeats the above-described operation to decode the bit stream 10 sequentially. Here the data portions 14a (see FIG. 2) of the bit stream 10 may include a plurality of Huffman codes which have been encoded using the same Huffman encoding book. Therefore, the decoding table is not necessarily changed by detecting an index number every time one Huffman encoding operation is completed. The number of Huffman codes included in the specified data portion 14a is predetermined in the decoding device 1000. For this reason, in the decoding device 1000, a decoding table to be used is changed by the table selecting device 104 after a specified number of Huffman codes are decoded using the same decoding table.

The above-described functions of the first and second Huffman decoder 105 and 106 may be carried out by a computer program. Hereinafter, the operation of such a computer program will be specifically described. Here, assume that an index number detected by the index detecting device 103 is "1", i.e., the first decoding table 100-1 (shown in FIG. 4) is chosen.

Figure 7A:
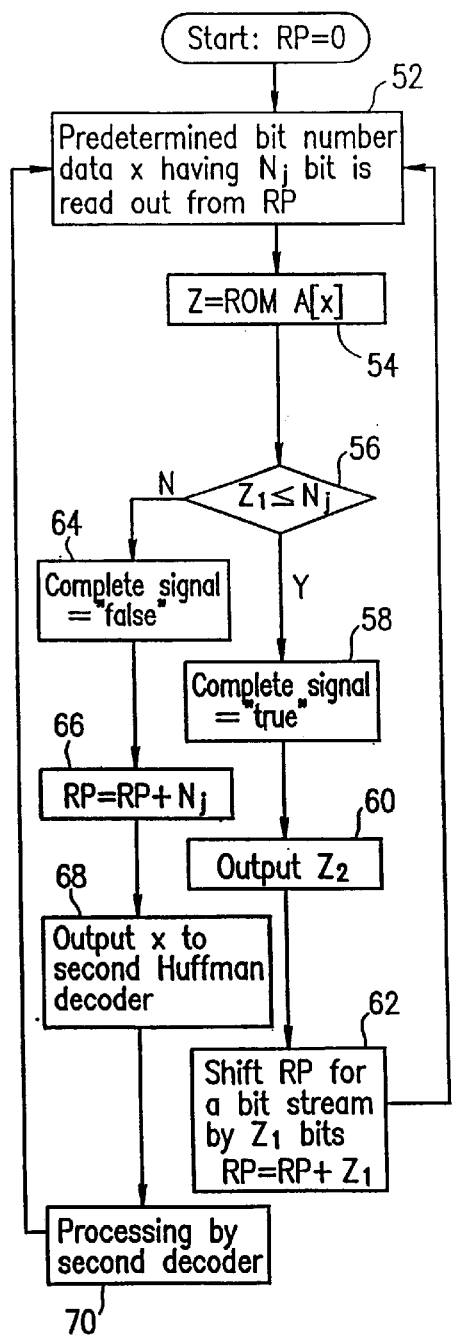
FIG. 7A is a flowchart showing the operation of a first Huffman decoder of a decoding device of the present invention.

FIG. 7A is a flowchart showing a decoding process (first decoding process) by the first Huffman decoder 105.

As described in FIG. 7A, in step 52, predetermined bit number data x having six bits (j=1 and $N_j=N_1=6$) is read from a reading position (RP) out of the bit stream 10.

In step 54, a data sequence Z at address x of the first region R1 of the first decoding table 100-1 is read out. Here among the data sequence Z at address x, $Z_1$ is data described in the first field 405 of the data sequence Z (i.e., the code length of a Huffman code or data representing that the Huffman decoding is not completed), and $Z_2$ is data described in the second field 406 of the data sequence Z (i.e., data representing the result of a decoding operation).

When the predetermined bit number data x read out is (000001), the first Huffman decoder 105 reads data at address (000001) of the first region R1 of the decoding table 100-1. As is seen from the decoding table 100-1 shown in FIG. 4, the first field stores a value "3" ($Z_1=3$). The second field stores a value "9" ($Z_2=9$). Thus, the predetermined bit number data x having six bits read out has three bits (000) at the MSB side thereof which completes a Huffman code. Information such that the result of a decoding operation is "9" is obtained.

It is then determined whether a Huffman code having six bits or less included in the six-bit data x read out has been Huffman-decoded or not (i.e., the predetermined bit number data having six bits completes a Huffman code). This is carried out by comparing the bit number "6" ($=N_1$) of the predetermined bit number data x with the code length $Z_1$ of a Huffman code (step 56). If $Z_1 \leq 6$, the six-bit data x completes a Huffman code. If $Z_1 > 6$, the six-bit data x does not complete a Huffman code. In the above-described example, as $Z_1(=3) \leq 6$, it is determined that the six-bit data x completes one Huffman decoding operation.

When the six-bit data x completes one Huffman decoding operation, the first Huffman decoder 105 outputs a complete signal CPT having a value "true" (step 58).

In this case, a value $Z_2$ stored in the second field 406 is also output as the result of the decoding (step 60), and a reading position (RP) for the bit stream 10 is shifted by $Z_1$ bits based on the data $Z_1$ stored in the first field (step 62). In the above-described example, the result of a decoding operation "9" is output in step 60 and the reading position for the bit stream 10 is shifted by three bits in step 62.

Thus, one Huffman decoding operation is completed. Thereafter, the decoding process returns to step 52 and a next Huffman decoding operation is carried out.

On the other hand, as is different from the above-example, when the first six-bit data x read out in step 52 is (111000), address 413 (111000) of the first decoding table 100-1 is read (step 54). As is seen from the first decoding table 100-1 shown in FIG. 4, the first field 405 stores a value "15" ($Z_1=15$) at address (111000). In this case, in step 56, since $Z_1$ (=15) is greater than six, it is determined that the $Z_1$ (=15) predetermined bit number data (111000) does not complete a Huffman code (i.e., the predetermined bit number data is not Huffman-decoded).

In this case, the first Huffman decoder 105 outputs a complete signal CPT having a value "false" (step 64), and then moves the reading position (RP) by six bits (step 66), and outputs the predetermined bit number data x to the second Huffman decoder 106 (step 68). Thereafter, the second Huffman decoder 106 carries out decoding (step 70).

The first Huffman decoder 105 carries out decoding in the above-described way. Hereinafter, the specific decoding operation (step 70) carried out by the second Huffman decoder 106 when the predetermined bit number data x is not completely decoded by the first Huffman decoder 105 will be described.

Figure 7B:
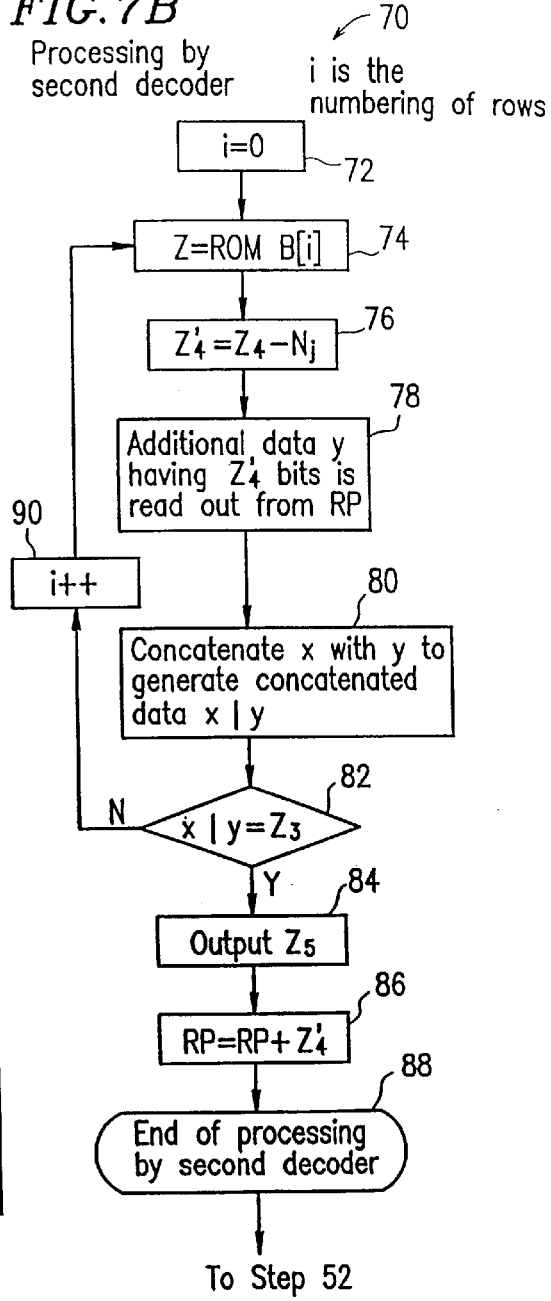
FIG. 7B is a flowchart showing the operation of a second Huffman decoder of a decoding device of the present invention.

FIG. 7B is a flowchart showing decoding by the second Huffman decoder 106 (second decoding process). As is seen from steps 68 and 66 of the flowchart shown in FIG. 7A, the second Huffman decoder 106 receives sixbit data x ($N_1=6$). The reading position (RP) of the bit stream is shifted by six bits (i.e., a position where the six-bit data x has been completely read out).

As represented in FIG. 7B, in step 72, a parameter which specifies a row to be read of the second region R2 is initialized to be zero. "i=0" represents the first row 413 of the second region R2 of the decoding table 100-1 (FIG. 4). In other words, in the decoding by the second Huffman decoder 106, the first row 413 of the second region R2 of the decoding table 100-1 is always read initially.

Thus, a data sequence Z=ROM B[0] in the first row 413 of the second region R2 of the decoding table 100-1 shown in FIG. 4 (i.e., a row corresponding to address (1000000) is read (step 74). Among the data sequence Z at address (1000000) of the second region R2, $Z_3$ represents data described in the third field 410 of the data sequence Z (i.e., Huffman codes having a code length more than six bits); $Z_4$ represents data described in the fourth field 411 of the data sequence Z (i.e., the code length of Huffman codes); and Z5 represents data described in the fifth field 412 of the data sequence Z (i.e., the results of decoding). Here assume that a Huffman code (1101000), a code length "7", and a result of a decoding operation "41" are read out as $Z_3$, $Z_4$, and $Z_5$.

Based on the data $Z_4$ described in the fourth field 411, a bit number $Z_4'$, which specifies the bit number of additional data y to be read out of the bit stream 10, is determined (step 76). $Z_4'$ is obtained by subtracting the value of the bit number $N_j$ of the predetermined bit number data x which has already read, from the code length $Z_4$. Here $Z_4'=1$ (=7−6).

Additional data y having one bit ($Z_4'=1$) following the predetermined bit number data x having six bits is read out of the bit stream 10 (step 78). This is because the second Huffman decoder 106 has already obtained the six-bit data x which the first Huffman decoder 105 read and output.

The predetermined bit number data x having six bits is then concatenated with the additional data y having one bit, resulting in the concatenated data x|y having seven bits (step 80).

It is then determined whether the seven-bit concatenated data x|y matches the Huffman code $Z_3$ stored in the third field 410 (step 82). When the matching is successful, the value $Z_5$ of the fifth field 412 is output as the result of the decoding (step 84). A reading position RP is further shifted by $Z_4'=1$ (step 86). Thus, the second Huffman decoder 106 completes one Huffman decoding operation (step 88). The process returns to step 52 of the flowchart shown in FIG. 7A to carry out a next Huffman decoding operation.

On the other hand, when the concatenated data x|y does not match the Huffman code $Z_3$ stored in the above-described third field 410 in step 82, the parameter i representing a row to be read of the second region R2 is incremented by one (step 90).

Thereafter, the decoding process returns to step 74, a data Z=ROM B[1] on the next row (i=1) (i.e., a row corresponding to address (1000001) of the second region R2 of the first decoding table 100-1 shown in FIG. 4) is read out. Following this, in accordance with procedures similar to the above-described procedures, it is determined whether the concatenated data x|y matches the Huffman code $Z_3$.

Here, as is seen from the first decoding table 100-1 shown in FIG. 4, the values of the data $Z_4$ of the first and second rows at addresses (1000000) and (1000001), respectively, have the same value "7". Therefore, the additional data to be read out is the same data. In this case, in the flowchart shown in FIG. 7B, steps 76 through 80 for generating the concatenated data can be omitted. To this end, a step for determining whether the value of $Z_4$ on the previous row matches the value of $Z_4$ on the row currently read out may be provided between step 74 and step 76. Alternatively, data indicating a row at which data $Z_4$ changes a value thereof from that of data $Z_4$ the previous row is prepared; and only when the value of the parameter i indicating a row of the table is equal to such data, steps 76 through 80 may be carried out.

The data sequence Z is read out of the rows of the second region R2. Based on the data $Z_4$ of the fourth field 411 of the data sequence Z read out, additional data y is read out of the bit stream 10 if necessary. The concatenated data is generated. These operations are repeated from the first row 413 (corresponding to the shortest Huffman code) of the second region R2 through the lowest row 414 (corresponding to the longest Huffman code) until the concatenated data x|y matches the Huffman code $Z_3$ instep 82. When the matching is successful, the fifth field value $Z_5$ of the data sequence is output as the result of the decoding (step 84).

Referring to the second decoding table 100-2 shown in FIG. 6, the operation of the decoding device 1000 when the index detecting device 103 detects index number 2 from the bit stream 10 will be described. The operation when index number 2 is detected is basically the same as the above-described operation when index number 1 is detected. Therefore, the description similar to that for the case where index number 1 is detected will be applied to this case.

Returning to FIG. 1, the bit stream 10 is input to the index detecting device 103, the first Huffman decoder 105, and the second Huffman decoder 106. The index detecting device 103 reads index number 2 out of the input bit stream 10. The table selecting device 104 chooses the second decoding table 100-2 based on the output (j=2) of the index detecting device 103.

The first Huffman decoder 105 reads predetermined bit number data x having a predetermined number $N_2=7$ of bits corresponding to index number 2 out of the bit stream 10. The first Huffman decoder 105 then decodes the predetermined bit number data x using the second decoding table 100-2. When the first Huffman decoder 105 completes the decoding, the first Huffman decoder 105 outputs a decoded signal representing the result of the decoding to the output selecting device 107. When the decoding is not completed, the first Huffman decoder 105 outputs the predetermined bit number data x read out to the second Huffman decoder 106. The first Huffman decoder 105 also outputs a completion signal CPT indicating whether one Huffman decoding operation is completed using the predetermined bit number data x, to the output selecting device 107.

The operation of the first and second Huffman decoders will be carried out in the following way.

The first Huffman decoder 105 reads the predetermined bit number data x' having seven bits, and reads data at address x' included in the first region R1 of the second decoding table 100-2 selected by the above-described table selecting device 104. When the value of x' is, for example, (0000001), address 617 (0000001) is read out. As is seen from the second decoding table 100-2 shown in FIG. 6, a value "1" is stored in the first field 607 of the data sequence of the first region R1. A value "0" is stored in the second field 608. This corresponds to the content of the first row 504 of the decoding table 500 shown in FIG. 5. In this case, the most significant one bit (0) of seven bits of the predetermined bit number data x' completes a Huffman code, so that a completion signal CPT representing the value "true" is output. A value (0) stored in the second field 608 is output as a decoded signal. Based on a value (1) stored in the first field 607, a reading position for the bit stream 10 is shifted by one bit.

On the other hand, when the predetermined bit number data x' having seven bits read out is, for example, (1111000), the first Huffman decoder 105 reads address 618 (1111000) of the first region R1 of the second decoding table 100-2. Here in the first field 607 a value "15" exceeding "7" is stored. This indicates that the predetermined bit number data (1111000) does not complete a Huffman code. In other words, the first Huffman decoder 105 does not Huffman-decode the predetermined bit number data x' based on the first region R1 of the second decoding table 100-2.

In this case, the first Huffman decoder 105 outputs a completion signal CPT having the value "false". The first Huffman decoder 105 also outputs the predetermined bit number data x' having seven bits read out to the second Huffman decoder 106. A reading position for the bit stream 10 is then shifted by seven bits. Thereafter, the second Huffman decoder 106 carries out the second decoding process.

The second Hufffman decoder 106 reads data sequences out of the second region R2 of the second decoding table 100-2 successively from the 128th address 603 (10000000) when the completion signal CPT is "false". A data sequence read out includes a Huffman code having a code length of more than seven bits, the code length of the Huffman code, and the result of decoding the Huffman code. These data sequences are stored from 128th address 603 (10000000) in order of the code length of the Huffman codes. Here the third field 611 stores Huffman codes. The fourth field 612 stores the code length of the Huffman codes. The fifth field 613 stores the results of decoding the Huffman codes. The second Huffman decoder 106 reads additional data y out of the bit stream 10 according to data stored in the fourth field 612 of the data sequence read out.

In this case, the fourth field 612 stores a value "8", so that one new bit is read out of the bit stream 10 as additional data y and a reading position is shifted by one bit. This is because the first Huffman decoder 105 has already read out the seven-bit data.

The first Huffman decoder 105 concatenates the seven-bit predetermined bit number data x with the additional data y. It is then determined whether the concatenated data matches data stored in the third field 611. Until the matching is successful, according to the above-described procedures, the data sequences are successively read out of the second region R2 of the table 100-2, and if necessary, additional data is read out of the bit stream 10. When the matching is successful, the value of the fifth field 613 is output as the result of the decoding.

The output selecting device 107 outputs a decoded signal of the first Huffman decoder 105 when the completion signal CPT is "true", and outputs a decoded signal of the second Huffman decoder 106 when the completion signal CPT is "false".

In the foregoing, the case where index number 1 or 2 is detected from the bit stream 10 is described. It will be appreciated that when another index number j is detected, a similar operation decodes Huffman codes using the j-th decoding table.

As described above, in the decoding device 1000 of Example 1, Huffman codes having a bit number smaller than or equal to the predetermined bit number included in the bit stream 10 are decoded by the first Huffman decoder 105 based on the first region R1 of a decoding table. On the other hand, Huffman codes having a bit number more than the predetermined bit number are decoded by the second Huffman decoder 106 based on the second region R2 of a decoding table. Accordingly, short Huffman codes which have high frequency of occurrence and a relatively small bit number are decoded at high speed by one access to a table, while long Huffman codes which have low frequency of occurrence and a relatively large bit number are decoded by using a relatively small space region within a table.

In Example 1, the predetermined number $N_j$ (i.e., the bit number of data read out by the first Huffman decoder 105 and the address width of the first region R1 of a decoding table) is, for example, set to six for $N_1$ and seven for $N_2$. This settings are, for example, provided based on the following reasons.

When the value of the predetermined number $N_1$ is large, the address width of the first region R1 of the first decoding table 100-1 is also large. The number of Huffman codes to be decoded using this region R1 is increased. These Huffman codes are certainly decoded by one table access. In this case, the number of Huffman codes to be decoded at high speed is thus increased.

On the other hand, when the value of the predetermined number $N_1$ is small, the number of Huffman codes to be decoded at high speed using the first region R1 is also small, though the overall size of the decoding table is reduced, thereby saving memory. This is because the first region R1 needs a plurality of addresses (e.g., 000000 through 000111) for decoding a Huffman code having a bit number (e.g., three) smaller than $N_1$ (e.g., six) included in the predetermined bit number data having $N_1$ bits read out; and the second region R2 only needs an address space having the same number of rows as that of Huffman codes. The decreased value of $N_1$ can relatively reduce the size of the first region R1 and enlarge the size of the second region R2. As a result, the overall size of the decoding table including the first and second regions R1 and R2 becomes relatively small.

According to this point of view, $N_1$ is set to an appropriate value by taking into account the number of Huffman codes to be decoded at high speed and the size of the decoding table. This value may be determined based on statistical properties by considering the frequency of occurrence of each Huffman code included in a Huffman encoding book. In particular, when a Huffman-encoded bit stream is decoded, it is preferable that short Huffman codes having a high frequency of occurrence are included in the first region R1, thereby being processed at high speed. The second region R2 can save memory, although long Huffman codes having a low frequency of occurrence included in the second region R2 are not decoded at high speed.

When a decoding device has a plurality of decoding tables, the predetermined numbers $N_1$ and $N_2$ may be determined by the following rule. For example, when it is statistically proved that the frequency of occurrence of the abovedescribed first Huffman encoding book is lower than that of the second Huffman encoding book (i. e., the second Huffman encoding book has a relatively high frequency of occurrence), a bit stream which has been Huffman-encoded with the second Huffman encoding book preferably may be decoded at high speed. In this case, the use of $N_2$ having a relative large value increases a probability of completing a Huffman code by one table access using the first region R1, resulting in high-speed processing. In this case, as is seen from the decoding table 100-2 shown in FIG. 6, the first region R1 has an address width of seven bits and therefore needs space for 128 addresses.

On the other hand, when the first Huffman encoding book has a low frequency of occurrence, a probability of decoding a bit stream which has been Huffman-encoded using the first Huffman encoding book is low, whereby it is often that high-speed processing is not required. Therefore, the small predetermined number $N_1$ can lead to a reduction in the table size. As shown in FIG. 4, the address width of the first region R1 of the first decoding table 100-1 is, for example, six bits. Thus, although a probability of completing one Huffman decoding operation by one table access is reduced, the first region R1 only needs space for 64 addresses.

Here it should be noted that when the predetermined number $N_j$ is set to an extreme value such as zero for a decoding table corresponding to a Huffman encoding book having a low frequency of occurrence, a probability of completing one Huffman decoding operation by one table access is significantly decreased, whereby a vast amount of processing load is likely to be required for decoding. Further, when $N_1$ is set to a value smaller than a minimum number of bit numbers which Huffman codes to be decoded can have, there is substantially no Huffman code which can be decoded using only the first region R1. In this case, the use of the first and second regions R1 and R2 substantially does not have an advantage such that high-speed decoding and memory savings can be both obtained. Therefore, $N_j$ is preferably set to at least a value equal to or greater than the minimum bit number of Huffman codes.

As described above, the value of the predetermined number $N_j$ may be predetermined in accordance with the frequency of occurrence of the j-th Huffman encoding book, i.e., the corresponding j-th decoding table. In other words, $N_j$ ($1 \leq j \leq m$) may be predetermined to satisfy $N_a \geq N_b$, when the frequency of selecting an a-th Huffman encoding book is equal to or greater than that of selecting an b-th Huffman encoding book where a, b, and j are integers and $1 \leq a \leq m$ and $1 \leq b \leq m$.

Alternatively, the predetermined number $N_j$ may be predetermined in such a manner that a probability of the first Huffman decoder 105 decoding a relatively short Huffman code included in the predetermined bit number data x is equal to or greater than a predetermined probability. To this end, assuming that $P_c$ is a probability of occurrence of Huffman codes having a code length of $X_c$ bits or less in Huffman-encoding using the c-th Huffman encoding book, a predetermined number $N_c$ may be predetermined to be equal to $X_c$ which obtains the probability $P_c$ equal to or greater than a predetermined value where c is an integer satisfying $1 \leq c \leq m$. The probability $P_c$ may, for example, be set to about 90%. In this case, the value of the predetermined number $N_j$ for each decoding table is determined based on statistical properties in such a manner that a probability of completing the decoding using the first region R1 of each decoding table is about 90%. The appropriate selection of the predetermined number $N_j$ allows high-speed Huffman decoding with at least the predetermined probability for a bit stream which has been encoded using any Huffman encoding book. In other words, the predetermined bit number data can be decoded with at least the predetermined probability. This can avoid a situation such that a decoding device does not operate satisfactorily because vast processing performance is required.

For the above-described reasons, in Example 1, the predetermined number $N_1$ for the first decoding table 100-1 and the predetermined number $N_2$ for the second decoding table 100-2 are set to six and seven, respectively. These predetermined numbers may be set to arbitrary numbers depending on Huffman encoding books, decoding tables, etc. used.

As described above, in the decoding device 1000 of Example 1, when Huffman decoding is carried out using a decoding table corresponding to a Huffman encoding book having a high frequency of occurrence, the Huffman decoding is completed by one table access if possible. When Huffman decoding is carried out using a decoding table corresponding to a Huffman encoding book having a low frequency of occurrence, the Huffman decoding is completed by multiple table accesses but by using as small a memory as possible. Example 1 can provide a decoding device in which a Huffman code having a high frequency of occurrence is decoded at high speed by one table access while a Huffman code having a low frequency of occurrence is decoded by multiple table accesses but by using as small a memory as possible.

EXAMPLE 2

In Example 2, a description will be given of a decoding device for decoding the bit stream 10 (shown in FIG. 2) in which Huffman encoding is carried out using a plurality of Huffman encoding books, similar to Example 1.

FIG. 8 shows a configuration of a decoding device 2000 according to Example 2 of this invention. The decoding device 2000 includes an index detecting device 203 for detecting index number j in the bit stream 10; first through m-th decoding tables 200-1 through 200-m, and a table selecting device 204 for choosing one of the first through m-th decoding tables 200-1 through 200-m.

The first through m-th decoding tables 200-1 through 200-m correspond to the respective Huffman encoding books for use in encoding, similar to the decoding tables 100-1 through 100-m of Example 1. Each of the decoding tables 200-1 through 200-m includes a first region R2 and a second region R2. The decoding tables will be described later in detail.

The decoding device 2000 further includes a first Huffman decoder 205, a second Huffman decoder 206, and an output selecting device 207. The first Huffman decoder 205 decodes short Huffman codes having a bit number smaller than or equal to a predetermined number. The second Huffman decoder 206 decodes long Huffman codes having a bit number exceeding the predetermined number $N_j$. The output selecting device 207 selects and outputs the results of decoding by the first and second Huffman decoders 205 and 206.

The first Huffman decoder 205 decodes Huffman codes having a relatively short code length of a bit number smaller than or equal to a predetermined number, which is included in the predetermined bit number data x which has been read out of the bit stream 10, using the first region R1 of a decoding table. When the first Huffman decoder 205 of Example 2 does not decode a Huffman code, the first Huffman decoder 205 outputs an address pointer ap, which specifies an address of the second region R2 of a decoding table, to the second Huffman decoder 206 instead of outputting predetermined bit number data x, as is different from the first Huffman decoder 105 of Example 1.

On the other hand, when the first Huffman decoder 205 does not complete Huffman decoding, the second Huffman decoder 206 reads additional data y following the predetermined bit number data x out of the bit stream 10. As is different from the second Huffman decoder 106 of Example 1, the second Huffman decoder 206 does not concatenate the additional data y with the predetermined bit number data x to obtain a concatenated data. The second Huffman decoder 206 carries out decoding based on the second region R2 of a decoding table using an address specified by the address pointer ap output from the first Huffman decoder 205 and the additional data y.

The decoding device 2000 of Example 2 also decodes a bit stream which has been encoded using a single Huffman encoding book. In this case, the index detecting device 203 and the table selecting device 204 are arbitrarily omitted. Only one decoding table corresponding to the single Huffman encoding book is necessary.

As described above, the decoding device 2000 decodes a relatively short Huffman code and a relatively long Huffman code using the different regions of a decoding table. Hereinafter, a decoding table used in the decoding device 2000 of Example 2 will be described in detail.

Figure 9:
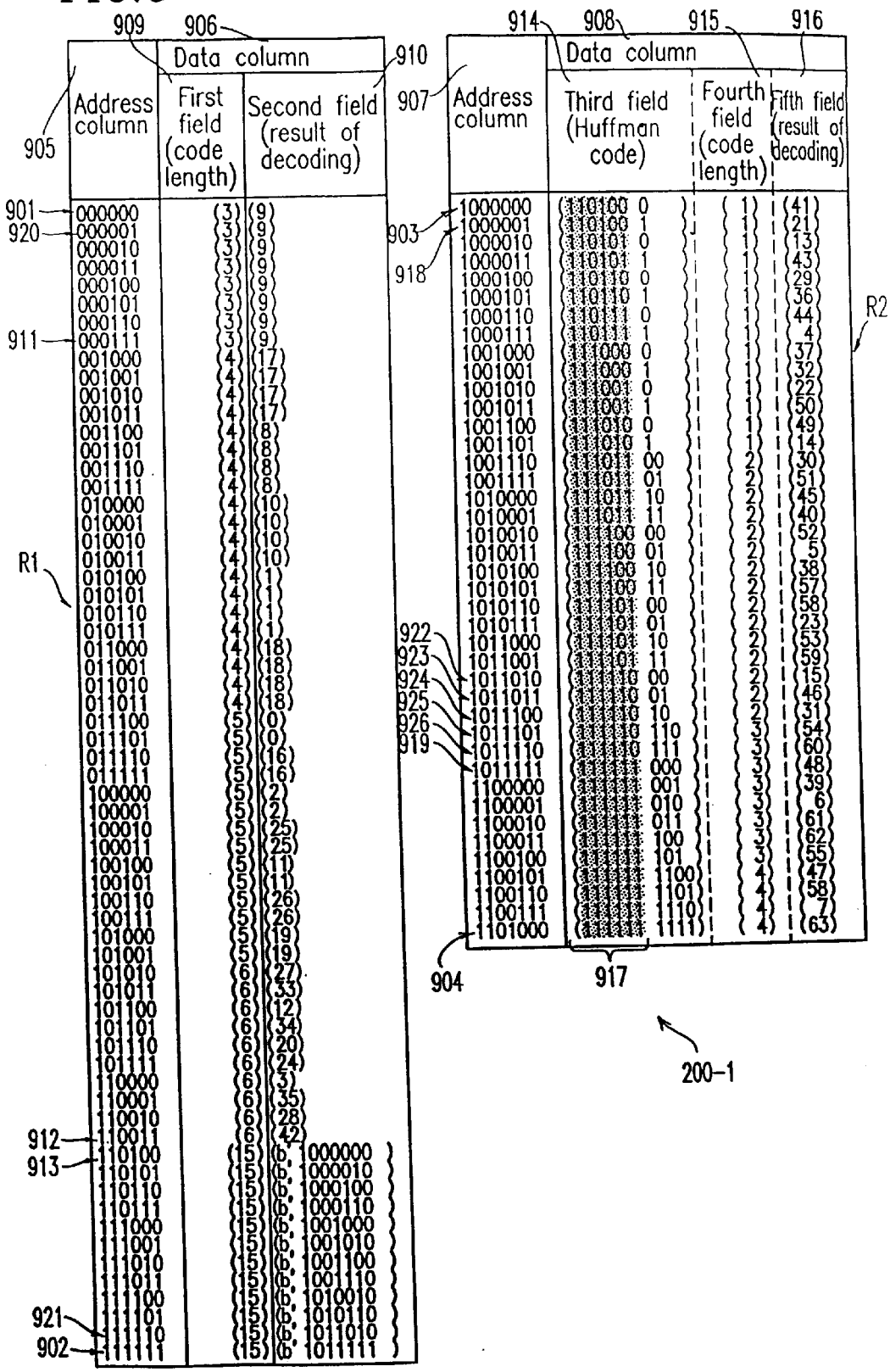
FIG. 9 is a diagram showing a first decoding table according to Example 2 of the present invention.
Figure 13:
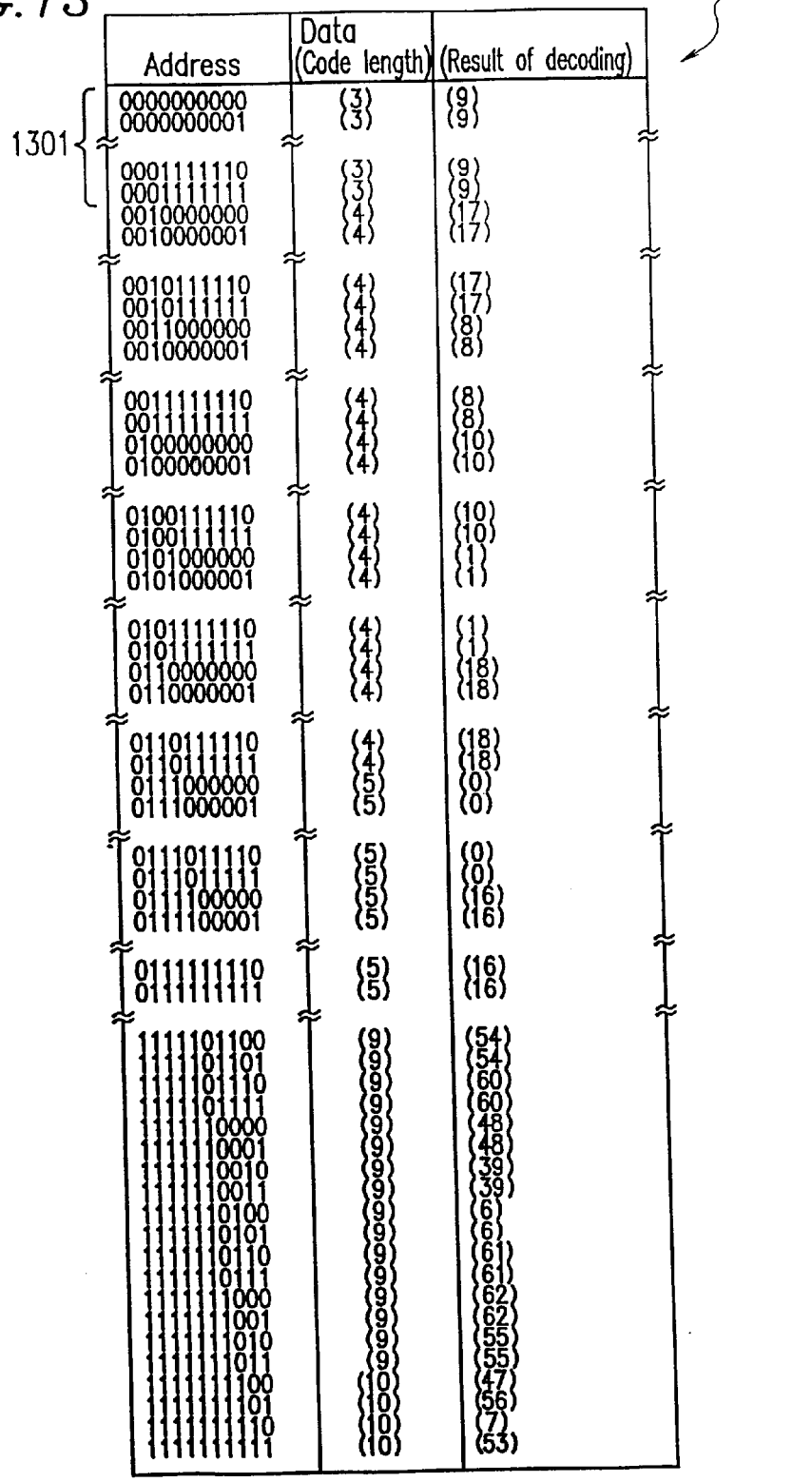
FIG. 13 is a diagram showing a decoding table for use in a conventional decoding system focusing on increasing a speed.

FIG. 9 shows the first decoding table 200-1 of Example 2. The first decoding table 200-1 is used for decoding a bit stream which has been encoded using the first Huffman encoding book which is identified with index number 1 included in the bit stream 10.

In Example 2, the Huffman encoding book 1100 shown in FIG. 11 is also used as the first Huffman encoding book. Therefore, the first decoding table 200-1 corresponds to the first decoding table 100-1 of Example 1 shown in FIG. 4.

As shown in FIG. 9, the first decoding table 200-1 includes the first region R1 and the second region R2. The first region R1 includes addresses having a width of six bits ranging from the 0th address 901 (000000) through the 63th ($2^6$–1) address 902 (111111). The second region R2 includes addresses having a width of seven bits ranging from the 64th address 903 (1000000) through the 104th address 904 (1101000). The first and second regions R1 and R2 have address columns 905 and 907 on the left side and data columns 906 and 908 on the right side, respectively. The data columns 906 and 908 store data corresponding to each address.

The data column 906 of the first region R1 includes a first field 909 (the left column of the data column 906) and a second field 910 (the right column of the data column 906). The first field 909 stores the code length of Huffman codes to be decoded. Specifically, when the predetermined bit number data x has six bits, the first field 909 at address x of the first region R1 stores the length of L bits which are at the MSB side of the six-bit data x and which correspond to a Huffman code included in the first Huffman encoding book (shown in FIG. 11) where L is an arbitrary integer satisfying $1 \leq L \leq 6$, representing code length). The second field 910 stores the results of decoding the Huffman codes or address pointers (next address).

The first field 909, for example, stores the same value "3" at address 901 (000000) through address 911 (000111). The second field 910 stores the same value "9" at address (000000) through address (000111). The six-bit data (000000) through (000111) are all the possible data of six bits which include the Huffman code (000) at the MSB side thereof. The result of decoding the Huffman code (000) is "9". Address 901 (000000) through address 911 (000111) correspond to the first row 1202 (i.e., a row corresponding to the Huffman code (000)) of the conventional decoding table 1200 shown in FIG. 12.

Further, the first field 909, for example, stores a value "6" at address 912 (110011). The second field 910 stores a value "42" at address 912 (110011). The six-bit data (110011) is only possible data of six bits which includes the Huffman code (110011) at the MSB side thereof (i.e., the whole data (110011)). The result of decoding the Huffman code (110011) is "42". Accordingly, address 912 (110011) corresponds to the 23th row 1206 (i.e., a row corresponding to the Huffman code (110011)) of the decoding table 1200 shown in FIG. 12.

As described above, the first decoding table 200-1 of Example 2 has a structure similar to that of the decoding table 100-1 of Example 1, in which each six-bit data row (i.e., rows corresponding address 901 (000000) through address 912 (110011)) includes any of Huffman codes.

Further, the first field 909, for example, stores a value "15" exceeding the predetermined number $N_j$ (=6) at address 913 (110100) where the six-bit data (110100) does not complete a Huffman code, similar to Example 1. However, the second field 910 stores (1000000) as an address pointer. This makes the first region R1 of the first decoding table 200-1 of Example 2 differ from the first region R1 of the first decoding table 100-1 of Example 1 shown in FIG. 4.

This address pointer specifies an address in the second region R2 of the decoding table 200-1. When the first Huffman decoder 205 does not complete the Huffman decoding, the second Huffman decoder 206 determines an address, from which the data columns are readout initially, in accordance with an address pointer ap output from the first Huffman decoder 205.

Specifically, the address pointer ap indicates one of the addresses of the second region R2 which relates to data in the data column of the second region R2 for decoding a Huffman code in which the most significant six bits thereof are the predetermined bit number data having six bits which has been read out by the first Huffman decoder 205. In particular, the address pointer ap indicates an address relating to data for decoding the shortest Huffman code of such Huffman codes. For example, an address pointer of the second field 910 at an address x (x is six-bit data) specifies an end point of a region in which a data sequence relating to a Huffman code having the shortest code length among the Huffman codes included in the first Huffman code book whose most significant six-bit data is x is stored. Therefore, in Example 2, the decoding table is constructed in such a manner that the second Huffman decoder 206 does not always read the first row 903 (i.e., a row corresponding to address (1000000)) of the second region R2 initially, but refers only to a region of the second region R2 in which Huffman codes including the predetermined bit number data which has been read out by the first decoder 205 can be decoded.

On the other hand, similar to the decoding table 100-1 of Example 1, the second region R2 of the decoding table 200-1 includes addresses having a width of seven bits. The data column 908 of the second region R2 of the decoding table 200-1 includes third, fourth, and fifth fields 914, 915, and 916.

The third field 914 of the second region R2 stores data corresponding to Huffman codes included in the first Huffman encoding book 1100 (shown in FIG. 11) which have a code length of more than six. In Example 2, the predetermined bit number data x which corresponds to the most significant $N_1$ (=6) bits of each of the Huffman codes is deleted from the Huffman code and the remaining portion of the Huffman code (Huffman partial code) is actually stored. The fourth field 915 stores a value resulting from subtracting $N_1$ (=6) from the code length of the Huffman code (i.e., the code length of the Huffman partial code described in the third field 914). The fifth field 916 stores the results of decoding a Huffman code obtained by concatenating predetermined bit number data x with additional data y. These stored data are stored at the 64th address 903 (address (1000000)) through the 104th address 904 (address (1101000)) in order of increasing Huffman code length. The portion 917 of the third field 914 of the second region R2 indicates the most significant $N_1$-bit data included in a Huffman code to be decoded (predetermined bit number data x). Although this portion 917 is provided in FIG. 9 for explanation of the table, an actual table has no need for the portion 917.

The third, fourth, and fifth fields 914, 915, and 916 at the 64th address 903 (address (1000000)) which is the first row of the second region R2 of the decoding table 200-1, for example, store a Huffman code (0), a code length "1" of a Huffman partial code, and the result of a decoding operation "41", respectively. These stored data correspond to the content of the 24th row 1207 (i.e., a row corresponding to a Huffman code (1101000)) of the decoding table 1200 shown in FIG. 12. Following this, the 65th address 918 (address (1000001)) through the 104th address 904 (address (1101000)) respectively store the contents of the 25th row 1208 (i.e., a row corresponding to a Huffman code (1101001)) through the 64th row 1203 (i.e., a row corresponding to a Huffman code (1111111111)) of the decoding table 1200 shown in FIG. 12.

Here the relationship between the first and second regions R1 and R2 constructed as described above is specifically described.

Referring to address 913 (110100) of the first region R1 of the first decoding table 200-1, for example, the first field 909 at address (110100) describes a value "15" for indicating that Huffman decoding is not completed; and the second field 910 describes an address pointer (1000000). The second region R2 has an area (target area) describing data relating to Huffman codes including predetermined bit number data (110100) which is also an address of the first region R1 (i.e., the Huffman code includes (110100) as the most significant six bits thereof). The target area corresponding to address (110100) of the first region R1, for example, includes two rows 903 and 918 (i.e., addresses (1000000) and (1000001)).

In this case, any address in a target area has seven bits. If taking into account the operation of the second Huffman decoder 206, the uppermost row in the target area (i.e., an end point of the target area) is preferably specified by an address pointer. Accordingly, an address pointer in the second field 910 at address 913 (110100) is set to (1000000).

Referring to address 902 (111111) of the first region R1, for example, the second field 910 at this address describes an address pointer (1011111). Here the second region R2 has a target area describing data relating to Huffman codes including predetermined bit number data (111111) which is also an address of the first region R1 (i.e., the Huffman code includes (111111) as the most significant six bits thereof). This target area includes address 919 (1011111) through address 904 (1101000)).

Similarly, the address pointer of the second field 910 is set to (1011111) in such a manner that the address pointer relates to the shortest Huffman code of the target area and indicates an address the uppermost row (i.e., a row which is an end point of the target area).

Next, the second decoding table 200-2 will be described. The second decoding table 200-2 has a structure similar to that of the above-described first decoding table 200-1.

FIG. 10 shows the second decoding table 200-2. The decoding table 200-2 is used for decoding Huffman codes which have been encoded using a second Huffman encoding book corresponding to index number 2. In Example 2, it is assumed that the second Huffman encoding book (not shown) is similar to that in Example 1. The second decoding table 200-2 corresponds to the second decoding book 100-2 of Example 1 shown in FIG. 6. As described above, FIG. 5 shows a conventional decoding table 500 obtained by rearranging the rows of the second Huffman encoding book (not shown) in order of increasing Huffman code length. The left column 501 of the decoding table 500 indicates Huffman codes. The middle column 502 indicates the code length of the Huffman codes. The right column 503 indicates the results of decoding the Huffman codes.

As is seen from FIG. 10, the second decoding table 200-2 includes the first region R1 and the second region R2. The first region R1 includes addresses having a width of seven bits ranging from the 0th address 1001 (0000000) through the 127th ($=2^7-1$) address 1002 (1111111). The second region R2 includes addresses having a width of eight bits ranging from the 128th address 1003 (10000000) through the 178th address 1004 (10110010).

Similar to the first decoding table 200-1, in the second decoding table 200-2, the first region R1 includes a first field 1005 and a second field 1006. The second region R2 includes third, fourth, and fifth fields 1007, 1008, and 1009.

Assuming that x' is data having seven bits, the first field 1005 at address x' of the first region R1 stores the length of L bits which are at the MSB side of the seven-bit data (address) x' and which correspond to a Huffman code included in the second Huffman encoding book (where L is an arbitrary integer satisfying $1 \leq L \leq 7$, representing code length). The second field 1006 stores the results of decoding the Huffman codes.

The first field 1005, for example, stores the same value "1" at address 1001 (0000000) through address 1010 (0111111). The second field 1006 stores the same value "0" at address 1001 (0000000) through address 1010 (0111111). The seven-bit data (0000000) through (0111111) are all the possible data of seven bits which include a Huffman code (0) as the most significant one bit thereof. "0" is the result of decoding the Huffman code (0). Address 1001 (0000000) through address 1010 (0111111) correspond to the first row 504 (i.e., a row corresponding to the Huffman code (0)) of the decoding table 500 shown in FIG. 5.

Further, the first field 1005, for example, stores a value "7" at address 1011 (1110100). The second field 1006 stores a value "3" at address 1011 (1110100). The most significant seven bits of the seven-bit data (1110100) (i.e., the whole data (1110100)) completes a Huffman code (1110100). The result of decoding the Huffman code (1110100) is "3". Accordingly, address 1011 (1110100) corresponds to the 13th row 505 (i.e., a row corresponding to the Huffman code (1110100)) of the decoding table 500 shown in FIG. 5.

Further, the first field 1005, for example, stores a value "15" exceeding "7" at address 1012 (1110101). This indicates that seven-bit data (1110101) does not complete a Huffman code. The second field 1006 describes an address pointer (10000000) for specifying an address in the second region R2 of the second decoding table 200-2. This address pointer indicates an address of the second region R2, similar to an address pointer shown in the above-described decoding table 200-1.

Specifically, an address pointer indicates one of addresses in the data described in the second region R2 which relates to data for decoding a Huffman code in which the most significant seven bits thereof are the predetermined bit number data having seven bits which has been read out by the first Huffman decoder 205. In particular, the address pointer indicates an address relating to data for decoding the shortest Huffman code of such Huffman codes (i.e., an end point of a target area).

On the other hand, the second region R2 of the decoding table 200-2 includes addresses having a width of eight bits. The data column of the second region R2 of the decoding table 200-2 includes third, fourth, and fifth fields 1007, 1008, and 1009, respectively, similar to the decoding tables in Example 1.

The third field 1007 of the second region R2 stores data corresponding to Huffman codes included in the first Huffman encoding book 1100 (shown in FIG. 11) which have a code length of more than seven. The predetermined bit number data x which corresponds to the most significant $N_2$ (=7) bits of each of the Huffman codes is deleted from the Huffman code, and the remaining portion of the Huffman code (Huffman partial code) is actually stored. The fourth field 1008 stores a value resulting from subtracting $N_2$ (=7) from the code length of the Huffman code (i.e., the code length of the Huffman partial code described in the third field 1007). The fifth field 1009 stores the results of decoding the Huffman codes. These stored data are stored at the 128th address 1003 (address (10000000)) through the 178th address 1004 (address (10110010)) in order of increasing Huffman code length. The portion 1013 of the third field 1007 of the second region R2 indicates most significant $N_2(=7)$-bit data included in a Huffman code to be decoded (predetermined bit number data x'). An actual table of course does not require the description portion 1013.

The third, fourth, and fifth fields 1007, 1008, and 1009 at the 128th address 1003 (address (10000000) which is the first row of the second region R2 of the decoding table 200-2, for example, store a Huffman code (0), a code length "1" of a Huffman partial code, and the result of a decoding operation "19", respectively. These stored data correspond to the content of the 14th row 506 (i.e., a row corresponding to a Huffman code (11101010)) of the decoding table 500 shown in FIG. 5. Following this, the 129th address 1005 (address (10000001)) through the 178th address 1004 (address (10110010)) store the respective contents of the 15th row 507 (i.e., a row corresponding to a Huffman code (11101011)) through the 64th row (i.e., a row corresponding to a Huffman code (111111111111)) of the decoding table 500 shown in FIG. 5.

Referring to address 1012 (1110101) of the first region R1 of the second decoding table 200-2, for example, the first field 1005 at address 1012 (1110101) describes a value "15" for indicating that Huffman decoding is not completed; and the second field 1006 describes an address pointer (10000000). The second region R2 has an area (target area) describing data relating to shortest Huffman codes including predetermined bit number data (1110101) as the most significant seven bits thereof which is also an address of the first region R1. The uppermost row (i.e., an end point of the target area) has address (10000000).

Referring to address 1002 of the first region R1 of the second decoding table 200-2, for example, the second field 1006 at this address describes an address pointer (10100100). Here the second region R2 has a target area describing data relating to shortest Huffman codes including predetermined bit number data (1111111) as the most significant seven bits thereof. The uppermost row has address (10100100).

The predetermined number $N_j$ (e.g., $N_1=6$ and $N_2=7$ in Example 2) is predetermined in the decoding device 2000 based on reasons similar to those described in Example 1 (e.g., statistical properties).

Hereinafter, the operation of the decoding device 2000 will be described.

Returning to FIG. 8, the bit stream 10 which has been Huffman-encoded is input to the index detecting device 203 and the first Huffman decoder 205 and the second Huffman decoder 206. In FIG. 8, thick-line arrows indicate the flow of data, and thin-line arrows the flow of control signals.

The index detecting device 203 detects an index number j from the bit stream 10 and outputs index number j to the table selecting device 204 (where j is an arbitrary integer satisfying $1 \leq j \leq m$; and m is an arbitrary integer representing the number of decoding tables included in the decoding device 2000). The table selecting device 204 chooses a j-th decoding table based on the received index number j. For example, when the index number detected by the index detecting device 203 is "1", the table selecting device 204 chooses the first decoding table 200-1.

The index detecting device 203 also outputs index number j to the first Huffman decoder 205. The first Huffman decoder 205 determines a predetermined number $N_j$ representing the number of bits of data to be read out of the bit stream 10, based on index number j (where $N_j$ is an arbitrary integer determined by j). The value of the predetermined number $N_j$ is determined to be equal to the address width of the first region R1 in the j-th decoding table selected by the table selecting device 204. For example, when the detected index number j is "1", the first Huffman decoder 205 determines that the predetermined number $N_1$ is "6". In Example 2, the relationship between index number j and the predetermined number $N_j$ is predetermined in the first Huffman decoder 205. A method for determining the predetermined number $N_j$ based on the received index number j is not limited to this.

The first Huffman decoder 205 then reads predetermined bit number data x having $N_j$ bits out of the bit stream 10 based on the predetermined number $N_j$. The predetermined bit number data x read out is then Huffman-decoded using the first region R1 of the j-th decoding table. Specifically, the first Huffman decoder 205 carries out decoding by comparing the predetermined bit number data having $N_j$ bits read out with the address having a width of $N_j$ bits included in the first region R1.

When the detected index number j is equal to "1" and the predetermined bit number data x having six bits read out is (000001), for example, the first Huffman decoder 205 reads data at address 920 (000001) of the first region R1 of the first decoding table 200-1. As is seen from the decoding table 200-1 shown in FIG. 9, the first field 909 stores a value "3". The second field 910 stores a value "9". Thus, information that the most significant three bits of the six-bit data x read out complete a Huffman code and the result of decoding the data x is "9" can be obtained.

As described above, when a relatively short Huffman code has been decoded, the first Huffman decoder 205 outputs a completion signal CPT having the value "true", which represents that one Huffman decoding operation is completed using the predetermined bit number data x, to the second Huffman decoder 206 and the output selecting device 207. The first Huffman decoder 205 also outputs the result of the decoding to the output selecting device 207. A reading position for th bit stream 10 is shifted by a number of bits corresponding the code length of the decoded Huffman code described in the first field 909.

Also in Example 2, the first Huffman decoder 205 decodes relatively short Huffman codes having a bit number smaller than or equal to a predetermined number $N_j$ included in predetermined bit number data x having $N_j$ bits. This is because the first region R1 defines the relationship between the predetermined bit number data x and the results of decoding Huffman codes included in the predetermined bit number data x. This decoding process only needs one access to a decoding table. Such short Huffman codes can be thus decoded at high speed.

When the detected index number j is equal to "1" and the predetermined bit number data x having six bits read out is (110100), for example, the first Huffman decoder 205 reads data at address 913 (110100) of the first region R1 of the first decoding table 200-1. As is seen from the decoding table 200-1 shown in FIG. 9, the first field 909 stores a value "15". The second field 910 stores an address pointer (1000000). In this case, since the value "15" in the first field 909 is greater than the predetermined number $N_1$ (=6), it is determined that the predetermined bit number data (110100) does not complete a Huffman code.

On the other hand, when the predetermined bit number data x having $N_j$ bits is not completely decoded, the first Huffman decoder 205 outputs a completion signal CPT having the value "false", which represents that the decoding is not completed, to the second Huffman decoder 206 and the output selecting device 207. The first Huffman decoder 205 also outputs an address pointer ap described in the second field 910 of the decoding table 200-1 to the second Huffman decoder 206. The reading position is shifted by the predetermined number $N_j$ bits.

In the decoding device 2000 of Example 2, as is different from Example 1, the predetermined bit number data x itself which has been read out by the first Huffman decoder 205 is not output into the second Huffman decoder 206. Hereinafter, the operation of the second Huffman decoder 206 when predetermined bit number data x is not decoded by the first Huffman decoder 105.

When a completion signal CPT represents "false", the second Huffman decoder 206 reads the data column of the second region R2 of a decoding table at an address specified by an address pointer ap received from the first Huffman decoder 205.

Additional data y following the predetermined bit number data x is then read out of the bit stream 10 based on data (i.e., the code length of the Huffman code portion) described in the fourth field 915 of the data column which has been read out.

The second Huffman decoder 206 Huffman-decodes the additional data y using the second region R2 of the j-th decoding table, and outputs the result of the decoding to the output selecting device 207. Specifically, the second Huffman decoder 206 carries out a matching test in which the additional data y is compared with the Huffman partial codes described in the third field 914 of the second region R2.

When the matching is successful, the second Huffman decoder 206 output data described in the fifth field 916 as the result of the decoding to the output selecting device 207.

On the other hand, when the matching is not successful, the second Huffman decoder 206 reads data on a row of the second region R2 of a decoding table next to the current row (i.e., a row corresponding to an address specified by the address pointer ap). A similar matching test is then carried out. The matching test is repeated starting from an address specified by an address pointer until the additional data y matches a Huffman partial code. In this process, new additional data is successively read out if necessary.

When the detected index number j is "1" and the six-bit data which is read by the first Huffman decoder 205 out of the bit stream 10 is (111110), the first Huffman decoder 205 outputs an address pointer (1011010) described in the second field 910 at address (111110) in the first region R1. The second Huffman decoder 206 reads data at address 922 (1011010) of the second region R2 in accordance with the address pointer. Here the third field 914 stores a Huffman partial code (00), the fourth field 915 stores a code length (2), and the fifth field 916 stores the result of a decoding operation "15". The second Huffman decoder 206 reads additional data y having two bits out of the bit stream 10 in accordance with the data stored in the fourth field 915.

Assume, for example, that the two-bit additional data y newly read out is (11). The third field 914 at address 922 (1011010) stores (00) as a Huffman partial code which does not match the additional data (11).

The second Huffman decoder 206 then reads data stored at address 923 (1011011) one row below address 922 (1011010) of the second region R2. Here the fourth field 915 stores (2), so that additional data y is not newly read out of the bit stream 10. This is because two-bit additional data has already read out of the bit stream 10.

In this case, the third field 914 at address 923 of the second region R2 stores (01) which does not match the additional data (11).

The second Huffman decoder 206 then reads data stored at address 924 (1011100) one row below address 923 (1011011) of the second region R2. Here the fourth field 915 stores (2), so that additional data y is not newly read out of the bit stream 10. In this case, the third field 914 at address 924 of the second region R2 stores (10) which does not match the additional data (11) again.

The second Huffman decoder 206 then reads data stored at address 925 (1011101) one row below address 924 (1011100) of the second region R2. Here the fourth field 915 stores (3), so that additional data having one (=3−2) bit is newly read out of the bit stream 10. The reading position for the bit stream 10 is shifted by one bit. This is because two-bit additional data has already read out when the data at address 922 (1011010) has been read out.

Assume that the further additional data y having one bit which has been newly read is (0) (i.e., the overall additional data y is (110)). Here the third field 914 at address 925 (1011101) describes (110) which matches the additional data y.

On the other hand, assume that the further additional data y is (1) (i.e., the overall additional data y is (111)). In this case, matching will be successful when the next row having address 926 (1011110) is read out.

When the matching is successful in this way, a value in the fifth field 916 is output as the result of a decoding operation.

The output selecting device 207 outputs the result of a decoding operation received from the first Huffman decoder 205 as an output signal when the completion signal is "true", and outputs the result of a decoding operation received from the second Huffman decoder 206 as an output signal when the completion signal is "false".

In this way, concatenated data including predetermined bit number data and additional data can be decoded. As is apparent from the above description, the concatenated data is not actually generated in Example 2.

The operation of the above-described first and second Huffman decoders 205 and 206 can be performed by a computer program, similar to Example 1. The computer program for Example 2 is carried out in accordance with a flow which is different in the following points from the flowchart shown in FIGS. 7A and 7B.

Specifically, in step 68 of the process by the first Huffman decoder 205 of the flowchart shown in FIG. 7A, data $Z_2$ in the second field 910 is output to the second Huffman decoder 206 instead of predetermined bit number data x.

In the process by the second Huffman decoder 206, a bit number $Z_4$ for additional data y to be read out does not need to be calculated in steps 76 and 78 of the flowchart shown in FIG. 7B. Instead of this, additional data y having $Z_4$ bits is read from a reading position RP. Moreover, generation of concatenated data x|y and comparison of the concatenated data x|y with $Z_3$ shown in steps 80 and 823 of the flowchart shown in FIG. 7B are not required. The additional data y itself is only compared with $Z_3$.

As described above, simpler decoding can be obtained in Example 2.

Hereinafter a description will be given of when an index number detected by the index detecting device 203 is When index number 2 has been detected, the table selecting device 204 chooses the second decoding table 200-2 (FIG. 10) and the first Huffman decoder 205 determines that the predetermined number $N_2$ is "7".

When the value of predetermined bit number data x' having seven bits which has been read out by the first Huffman decoder 205 is (0000001), the first Huffman decoder 205 reads data at address (0000001) of the first region R1 of the second decoding table 200-2. As is seen from the second decoding table 200-2 shown in FIG. 10, the first field 1005 stores a value "1". The second field 1006 stores a value "0". Thus, information that the seven-bit data x' completes a Huffman code by the most significant one bit (0) thereof and the result of a decoding operation is "0" is obtained.

In this case, the first Huffman decoder 205 outputs a completion signal CPT having the value "true", which represents that one Huffman decoding operation is completed with prescribed bit number data, to the second Huffman decoder 206 and the output selecting device 207. The first Huffman decoder 205 outputs the result of a decoding operation "0" stored in the second field 1006 to the output selecting device 207. A reading position for the bit stream 10 is shifted by one bit in accordance with data described in the first field 1005.

On the other hand, when the predetermined bit number data x' having seven bits which has been read out is (1111101), data at address 1013 of the first field R1 of the second decoding table 200-2 is read out. Here, as is seen from the second decoding table 200-2 shown in FIG. 10, the first field 1005 stores a value "15". The second field 1006 stores an address pointer (10010110). In this case, the value "15" in the first field 1005 is greater than the predetermined number $N_2$ (=7), so that it is determined that Huffman decoding is not completed using the predetermined bit number data (1111101).

In this case, the first Huffman decoder 205 outputs a completion signal CPT having the value "false", which represents that decoding is not completed, to the second Huffman decoder 206 and the output selecting device 207. The first Huffman decoder 205 outputs an address pointer (10010110), which is described in the second field 1006 of the first region R1 of the second decoding table 200-2, to the second Huffman decoder 206. Further, a reading position is shifted by the predetermined number seven bits.

Using the address pointer, the second Huffman decoder 206 reads out data at address 1014 (10010110) of the second region R2. Here the third field 1007 stores a Huffman partial code (00), the fourth field 1008 stores a code length (2), and the fifth field 1009 stores the result of a decoding operation "50". The second Huffman decoder 206 reads additional data y having two bits out of the bit stream 10 in accordance with the data stored in the fourth field 1008.

Assume, for example, that the two-bit additional data y newly read out is (10). The third field 1007 at address 1014 (10011010) stores (00) as a Huffman partial code which does not match the additional data (10).

The second Huffman decoder 206 then reads data stored at address 1015 (10010111) one row below address 1014 (10010110) of the second region R2. Here the fourth field 1008 stores (2), so that additional data y is not newly read out of the bit stream 10. This is because the two-bit additional data (10) has already read out of the bit stream 10.

In this case, the third field 1007 at address 1015 of the second region R2 stores (01) which does not match the additional data (10).

The second Huffman decoder 206 then reads data stored at address 1016 (10011000) one row below address 1015 (10010111) of the second region R2. Here the fourth field 1008 stores (3), so that additional data y having one (=3−2) bit is newly read out of the bit stream 10. The reading position for the bit stream 10 is shifted by one bit. This is because the two-bit additional data (10) has already read out when the data at address 1014 (10010110) has been read out.

Assume that the further additional data y having one bit which has been newly read is (0) (i.e., the overall additional data y is (100)). Here the third field 1007 at address 1016 (10011000) describes (100) which matches the additional data y.

On the other hand, assume that the further additional data y is (1) (i.e., the overall additional data y is (101)). In this case, matching will be successful when the next row having address 1017 (10011001) is read out.

When the matching is successful in this way, a value in the fifth field 1009 is output as the result of a decoding operation.

The output selecting device 207 outputs a decoded signal of the first Huffman decoder 205 when the completion signal CPT is "true", and outputs a decoded signal of the second Huffman decoder 206 when the completion signal CPT is "false".

As described above, in Example 2, similar to Example 1, when Huffman decoding is carried out using a decoding table corresponding to a Huffman encoding book having a high frequency of occurrence, the Huffman decoding is completed by one table access if possible. When Huffman decoding is carried out using a decoding table corresponding to a Huffman encoding book having a low frequency of occurrence, the Huffman decoding is completed by multiple table accesses but by using as small a memory as possible. Example 2 can provide Huffman decoding in which a Huffman codes having a high frequency of occurrence (i.e., the code length is short) is decoded by one table access at high speed while a Huffman code having a low frequency of occurrence (i.e., the code length is long) is decoded by multiple table accesses but by using as small a memory as possible.

In the decoding device 2000 of Example 2, data described in the third field of the second region R2, which represents a Huffman partial code, is obtained by deleting the most significant $N_j$ bits from a Huffman code. Data described in the fourth field, which represents the code length of a Huffman code, is obtained by subtracting $N_j$ from the code length of the original Huffman code. As a result, the second region R2 requires lesser capacity.

In the decoding device 2000 of Example 2, the matching test in the second region R2 requires additional data and a Huffman partial code both having a smaller number of bits. Therefore, this is carried out at a higher speed than when a longer Huffman code is decoded. In Example 2, an address to be read initially is determined in accordance with an address pointer included in the first region R1, thereby omitting a step of reading a portion of the data column unnecessary for decoding. This further improves the efficiency of decoding.

According to this invention, relatively short codes included in data having bits smaller than or equal to a predetermined number and relatively long codes included in data having bits greater than a predetermined number are decoded using different regions of a decoding table, respectively. This technique makes it possible that the relatively short codes are decoded at high speed and tables for decoding the relatively long codes have as small a memory as possible. Therefore, the decoding device can carry out decoding at high speed while saving memory.

In particular, when the decoding device of this invention is used as a decoding device for decoding a Huffman code, the decoding device can carry out decoding at high speed while saving memory.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A decoding device for decoding a data stream comprising:
   a decoding table including a first region and a second region;
   a first decoder; and
   a second decoder,
   wherein:
      the first region defines a relationship between first data having a predetermined number of bits and a result of decoding a portion of the first data having bits smaller than or equal to the predetermined number;
      the second region defines a relationship between concatenated data obtained by concatenating the first data with second data having additional bits and a result of decoding the concatenated data;
      the first decoder reads the first data from the data stream; decodes the portion of the first data based on the first region; determines whether the decoding of the portion of the first data is completed or not; and when the decoding of the portion of the first data is completed, outputs a result of the decoding of the portion of the first data; and
      when the decoding of the portion of the first data is not completed, the second decoder reads the second data out of the data stream; concatenates the first data with the second data to generate the concatenated data; decodes the concatenated data based on the second region; and outputs a result of the decoding of the concatenated data.

2. A decoding device according to claim 1 further comprising:
   a plurality of decoding tables; and
   a selector for selecting one of the plurality of decoding tables;
   wherein:
      the predetermined number which is a bit number of the first data corresponding to each of the plurality of decoding tables is predetermined in accordance with a frequency of selection for each of the plurality of decoding tables.

3. A decoding device according to claim 2, wherein the bit number of the first data corresponding to each of the plurality of decoding tables is predetermined in such a manner that a probability that the first decoder completes the decoding of the portion of the first data is equal to or greater than a predetermined probability.

4. A decoding device according to claim 1, wherein:
   the first region includes:
      a first field for describing the code length of the portion of the first data or a code indicating that the decoding of the portion of the first data is not completed; and
      a second field for describing a result of the decoding of the portion of the first data;
   the first region is accessed using the first data as an address; and
   the second region includes:
      a third field for describing the concatenated data;
      a fourth field for describing the code length of the concatenated data; and
      a fifth field for describing a result of the decoding the concatenated data.

5. A decoding device for decoding a data stream comprising:
   a decoding table including a first region and a second region;
   a first decoder; and
   a second decoder,
   wherein:
      the first region defines a relationship between first data having a predetermined number of bits and a result of decoding a portion of the first data having bits smaller than or equal to the predetermined number;
      the second region defines a relationship between second data having additional bits and a result of decoding concatenated data, and the concatenated data is obtained by concatenating the first data with the second data;
      the first decoder reads the first data from the data stream; decodes the portion of the first data based on the first region; determines whether the decoding of the portion of the first data is completed or not; when the decoding of the portion of the first data is completed, outputs a result of the decoding of the portion of the first data; and when the decoding of the portion of the first data is not completed, specifies an address of the second region;
      when the decoding of the portion of the first data is not completed, the second decoder reads the second data out of the data stream; and outputs a result of the decoding of the concatenated data based on the address specified by the first decoder and the second data.

6. A decoding device according to claim 5 further comprising:
   a plurality of decoding tables; and
   a selector for selecting one of the plurality of decoding tables;
   wherein:
      the bit number of the first data corresponding each of the plurality of decoding tables is predetermined in accordance with a frequency of selection for each of the plurality of decoding tables.

7. A decoding device according to claim 6, wherein the bit number of the first data corresponding to each of the plurality of decoding tables is predetermined in such a manner that a probability that the first decoder completes the decoding of the portion of the first data is equal to or greater than a predetermined probability.

8. A decoding device according to claim 5, wherein:
   the first region includes:
      a first field for describing the code length of the portion of the first data or a code indicating that the decoding of the portion of the first data is not completed; and
      a second field for describing a result of the decoding of the portion of the first data or a pointer specifying an address of the second region;
   the first region is accessed using the first data as an address; and
   the second region includes:
      a third field for describing the second data;
      a fourth field for describing the code length of the second data; and a fifth field for describing a result of the decoding the concatenated data.

9. A decoding device according to claim 5, wherein the first decoder specifies an address corresponding to the second data having the shortest length among a plurality of addresses relating to the first data.

10. A decoding device according to claim 1, wherein the data stream includes a plurality of Huffman codes; and
the first and second decoders decode the plurality of Huffman codes.

* * * * *